United States Patent
Chen

(10) Patent No.: US 7,126,136 B2
(45) Date of Patent: Oct. 24, 2006

(54) NANOPARTICLE OPTICAL STORAGE APPARATUS AND METHODS OF MAKING AND USING SAME

(75) Inventor: Wei Chen, Stillwater, OK (US)

(73) Assignee: Nomadics, Inc., Oklahoma city, OK (US)

( * ) Notice: Subject to any disclaimer, the term of this patent is extended or adjusted under 35 U.S.C. 154(b) by 0 days.

(21) Appl. No.: 11/067,373

(22) Filed: Feb. 25, 2005

(65) Prior Publication Data

US 2005/0253095 A1 Nov. 17, 2005

Related U.S. Application Data

(63) Continuation of application No. 10/223,764, filed on Aug. 19, 2002, which is a continuation-in-part of application No. 10/166,313, filed on Jun. 6, 2002.

(60) Provisional application No. 60/356,542, filed on Feb. 11, 2002, provisional application No. 60/313,236, filed on Aug. 17, 2001.

(51) Int. Cl.
*H05B 33/00* (2006.01)
*G03B 42/08* (2006.01)

(52) U.S. Cl. .................. 250/484.4; 250/581; 250/584
(58) Field of Classification Search ............ 250/484.4, 250/581, 584
See application file for complete search history.

(56) References Cited

U.S. PATENT DOCUMENTS

| | | | | |
|---|---|---|---|---|
| 4,521,904 | A | * | 6/1985 | Takano ....................... 378/185 |
| 5,811,822 | A | * | 9/1998 | Huston et al. ........... 250/484.4 |
| 6,307,212 | B1 | * | 10/2001 | Huston et al. .............. 250/580 |
| 6,583,434 | B1 | * | 6/2003 | Struye et al. ............... 250/581 |

* cited by examiner

*Primary Examiner*—David Porta
*Assistant Examiner*—Mindy Vu
(74) *Attorney, Agent, or Firm*—Dunlap, Codding and Rogers P.C.

(57) ABSTRACT

The present invention relates in general to nanoparticles exhibiting luminescence such as photostimulated luminescence or photoluminescence and optical switching processes based upon such properties, in more particular, the use of such photostimulated luminescence exhibiting nanoparticles and switching nanoparticle for optical storage apparatuses and sensors as well as methods of making and using same.

21 Claims, 20 Drawing Sheets

NANOPARTICLE OPTICAL STORAGE APPARATUS AND METHODS OF MAKING AND USING SAME

CROSS-REFERENCE TO RELATED APPLICATIONS

This application is a continuation of U.S. Ser. No. 10/223,764 filed Aug. 19, 2002, which is a continuation-in-part of co-pending U.S. application Ser. No. 10/166,313, filed Jun. 6, 2002, entitled "UPCONVERSION LUMINESCENCE MATERIALS AND METHODS OF MAKING AND USING SAME." This application also claims priority under 35 U.S.C. § 119(e) to 1) the provisional patent application identified by U.S. Ser. No. 60/356,542, filed on Feb. 11, 2002, entitled "REVERSIBLE OPTICAL PROCESSES AND OPTICAL STORAGE OF NANOPARTICLES;" and 2) the provisional patent application identified by U.S. Ser. No. 60/313,236, filed Aug. 17, 2001, entitled "NANOPARTICLE PHOTOSTIMULATED LUMINESCENCE BASED OPTICAL STORAGE AND SENSORS." The entire contents of all patent applications referenced herein are hereby expressly incorporated herein in their entirety by reference.

STATEMENT REGARDING FEDERALLY FUNDED RESEARCH

The Government owns certain rights in and to this application pursuant to (i) a grant from the National Science Foundation Grant No. DMI-0060254, (ii) a grant from the National Science Foundation Grant No. DMI-0132030, and (iii) an Air Force Office of Scientific Research Contract No. F49620-00-C-0058.

BACKGROUND OF THE INVENTION

1. Field of the Invention

The present invention relates in general to nanoparticles exhibiting luminescence such as photostimulated luminescence or photoluminescence and optical switching processes based upon such properties, in more particular, the use of such photostimulated luminescence exhibiting nanoparticles and switching nanoparticle for optical storage apparatuses and sensors as well as methods of making and using same.

2. Background of Art

The use of nanoparticles or quantum dots exhibiting photostimulated luminescence ("PSL") for the storage of digital information offers a tremendous advance in the digital storage art. Traditionally, cost-effective storage of information required ultrahigh packing densities as well as inexpensive self-assembling techniques and fast methods for writing and retrieving information. Semiconductor quantum dots (QDs), which involve a few thousand atoms, offer an attractive path toward achieving these goals. Single-electron storage has been suggested in the art as a possibility with quantum dots. Charge storage devices based on the resistivity change of a two-dimensional electron gas located near a layer of self-assembled QDs have been demonstrated by those skilled in the art at low temperature. A memory cell based on field-effect tunable lateral potential modulation in the plane of a semiconductor quantum well and acoustically driven storage in quantum wells have also been proposed and demonstrated by those skilled in the art. The storage characteristics of these approaches are limited to short duration (several hundred microseconds) at very low temperatures.

Optical storage and retrieval of excitons in semiconductor self-assembled quantum dots have been demonstrated but the storage times were only on the order of several seconds at very low temperatures. Such a short storage time is not long enough for practical application. Herein is claimed and disclosed an optical storage apparatus and methods of use utilizing nanoparticles exhibiting photostimulated luminescence and/or optical switch process at room temperature with a storage longevity on the order of multiple hours.

Photostimulated luminescence is a process in which trapped charges are released by photons to produce luminescence through recombination and has been previously studied extensively in the area of X-ray radiology. The use of photostimulable $BaFBr:Eu^{2+}$ phosphors for X-ray storage and imaging has proven to be one of the most successful detectors in digital radiography. The photostimulated luminescence mechanism of $BaFBr:Eu^{2+}$ involving X-ray irradiation proposed by Takahashi et al. assumed that, during X-ray irradiation, the $Eu^{2+}$ ions are partly ionized into their trivalent charge state ($Eu^{3+}$) and the liberated electrons drift via the conduction band to form F centers. Upon subsequent photostimulation, the electrons are released from the F centers into the conduction band and thereafter recombine with $Eu^{3+}$ ions to produce the photostimulated luminescence of $Eu^{2+}$ at 390 nm.

A general erasable optical storage apparatus using photostimulated luminescence is shown displayed in FIG. 1. As shown in FIG. 1, the writing light can be either ultra-violet (UV) or blue or any other light having energy higher than the energy gap of the host materials (i.e. the writing light is variable and will depend on the energy gap of the host material). The reading light can be visible or infrared (IR) light, the choice of reading light is also variable and depends on the trap depth of the host material. Semiconductors such as MgS, CaS, SrS, and SrSe doped with rare earth elements such as Ce, Sm, and Eu have been previously considered for optical storage and dosimetric applications. These materials possess a high sensitivity for radiation energy storage and a high PSL efficiency under IR stimulation. However, they suffer from significant fading at room temperature due to their narrow band gaps and the fact that their shallow trap depths do not efficiently store energies. The PSL nanoparticles of the presently claimed and disclosed invention overcome such limitations in the art.

An application of PSL phosphors is medical imaging storage. Such PSL phosphors must posses the properties of high density, high brightness, short decay lifetimes, suitable emission energy and stimulation energy and low light scattering. The energy structure in the phosphors is critical to the effective operation of the detector. The trap depth to the conduction band must be small enough so that stimulation with laser light is possible, yet sufficiently large to prevent random thermal release of the electron from the trap. Generally, the trap depth should be larger than 0.5 eV to prevent thermal release or fading at room temperature. In addition, the wavelength separation between the stimulation light for reading (corresponding to the color center absorption band) and the monitored emitting light of the recombination center should be sufficiently large so that noise signals due to reading light reflection are avoided. The phosphors may have only one type of trap to thereby reduce signal loss due to electron migration among different traps. Currently in the art, there is no PSL phosphor that meets all of these stated requirements. The photostimulable phosphor used in commercial X-ray imaging system is $BaFBr:Eu^{2+}$. Yet, the $BaFBr:Eu^{2+}$ system suffers from poor resolution due to the long decay lifetime of $Eu^{2+}$ emission (0.8 μs) as well as scattering of the stimulating laser light from the plate-like polycrystals. In addition, the hygroscopic nature of this phosphor limits the stability of the system.

Recently, it was disclosed that CdSe nanoparticles can transfer in a metastable 'dark' state by heating, in which the luminescence is quenched. Further, the luminescence returns when the material is exposed to light. Such a nanoparticle capable of reversible change is also useful for optical storage and sensor applications. Contrary to this disclosure, another group observed that it is possible to turn on fluorescence in thin layers of silver oxide, which are initially non-fluorescent, by exposing them to a light source having wavelengths less than 520 nm. Once photoactivated, the silver oxide layers exhibit multicolored fluorescence under excitation by both blue (450 to 480 nm) and green (510 to 550 nm) light. Blue excitation causes the layer to fluoresce in multicolored hues, but only intermittently. Green excitation, however, results in brighter and steadier red fluorescence. Such "caged" fluorescent nanoparticles of silver may be rapidly switched on and used, for example, as nanoscopic optical storage elements or as probes in living systems. Similarly, an additional group showed photosensitivity in $Ag^+$ doped phosphate. Presently, claimed and disclosed is an optical storage apparatus(es), sensors, and methods of making and using same based on the reversible optical processes of rare-earth ion doped nanoparticles, such as $Y_2O_3$:Eu3+ nanoparticles, at room temperature.

SUMMARY OF THE INVENTION

The present invention relates in general to nanoparticles exhibiting luminescence such as photostimulated luminescence or photoluminescence and optical switching processes based upon such properties, in more particular, the use of such photostimulated luminescence exhibiting nanoparticles and switching nanoparticle for optical storage apparatuses and sensors as well as methods of making and using same.

DETAILED DESCRIPTION OF THE INVENTION

Figure 1:
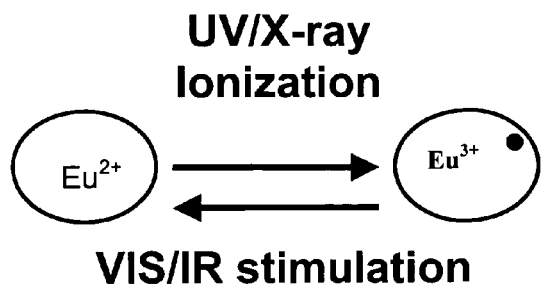
FIG. 1 is schematic illustration of PSL process in $Eu^{2+}$ doped nanoparticles.

Before explaining at least one embodiment of the invention in detail, it is to be understood that the invention is not limited in its application to the details of construction, experiments, exemplary data, and/or the arrangement of the components set forth in the following description or illustrated in the drawings. The invention is capable of other embodiments or of being practiced or carried out in various ways. Also, it is to be understood that the phraseology and terminology employed herein is for purpose of description and should not be regarded as limiting.

Figure 2:
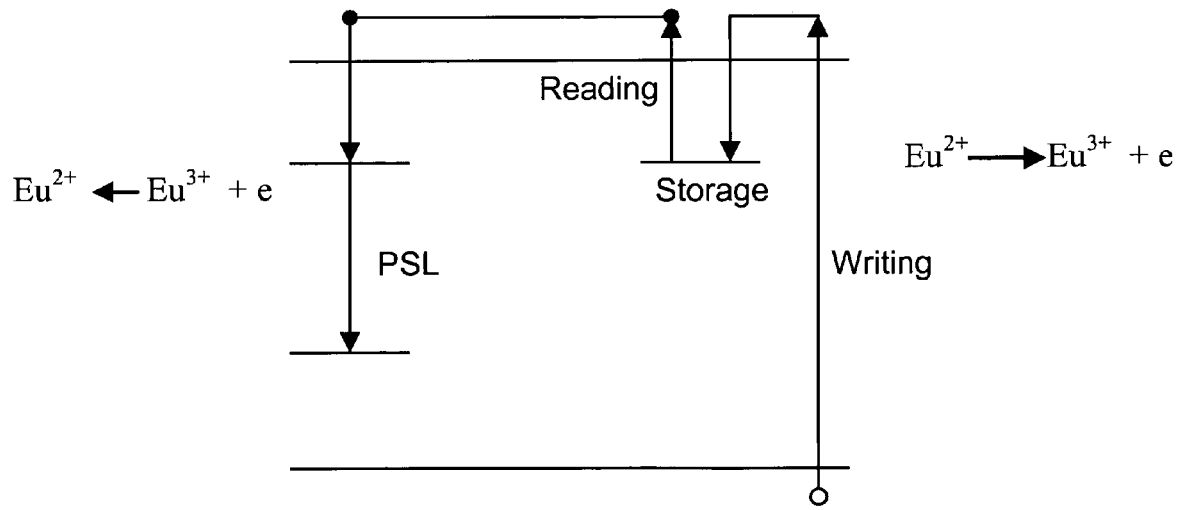
FIG. 2 is a schematic model of PSL storage mechanisms.

Upon activation by light, target nanoparticles are capable of being changed back and forth from one state to the other. One such example is shown in FIG. 1 for $Eu^{2+}$-doped nanoparticles. One type of state change is accompanied by a luminescence in which the excitation energy is lower than the emission energy. This type of luminescence is called photostimulated luminescence (PSL). The mechanism of PSL storage is illustrated in FIG. 2. In a doped nanoparticle such as $ZnS:Eu^{2+}$, upon excitation or irradiation of the particles with an energy gap larger than the energy gap of the host (i.e. ZnS), electrons and holes are generated in the conduction and the valence bands, respectively. Meanwhile, defects are also created. Electrons may be trapped at the defects to form color centers, and holes may combine with $Eu^{2+}$ to form $Eu^{3+}$ or $(Eu^{2+}+h)$ complex. When the nanoparticles are stimulated with light corresponding to the absorption band of the color centers, the electrons will be detrapped from the defects and recombine with $Eu^{3+}$ or $[Eu^{2+}+h]$ to give the luminescence of $Eu^{2+}$ which is called PSL.

The concept of PSL is herein used to develop a general erasable optical storage material and apparatus developed therefrom as displayed in FIG. 2. For use with a generable erasable optical storage material, the writing light can be ultra-violet (UV, including vacuum-UV and extreme-UV), blue, X-ray, α-particle, β-particle or γ-ray as determined by the energy gap of the host materials. The reading light can be visible or infrared (IR) as necessitated by the trap depth. Semiconductors like MgS, CaS, SrS, and SrSe, doped with different rare earth elements such as Ce, Sm, and Eu, have been considered for optical storage and dosimetric applications. These materials possess a high sensitivity for radiation energy storage and a high PSL efficiency under IR stimulation. However, they suffer from significant fading at room temperature due to their narrow band gaps and the shallow traps for storing the energy.

In nanoparticles, the energy structure can be modified via quantum size confinement. This offers a new way of designing PSL phosphors. When electrons and holes are produced in nanoparticles by excitation, the electrons and holes may de-excite or relax to the lowest excited states and recombine to give luminescence. They also may be trapped by electron or hole traps at the surfaces, interfaces, or/and in the surrounding matrix. The electrons or holes at traps are in a metastable state. When stimulated by light or by heat some electrons or holes may be released and go back to the nanoparticles, recombining to provide luminescence—i.e., photostimulated luminescence (PSL) or thermoluminescence.

Controlled charge separation and trapping in nanoparticles are key to the instantly described and claimed materials, apparatus(es), and process(es) for reversable optical storage, sensors, and digital imaging. The PSL of nanoparticles requires not only charge separation and trapping, but also the return of the carriers to the nanoparticles. Evidence for the charge separating, trapping, and returning has been obtained from pump-probe measurements and photon-gated hole-burning (PHB) of nanoparticles. For example, in $BaFCl:Sm^{2+}$, the hole-burning process can be described as the photoionization reaction:

$$Sm^{2+}+(trap) \leftrightharpoons Sm^{3+}+(trap)^-.$$

If the electrons release from the traps and return to the $Sm^{2+}$, the hole will be erased and is called hole-filling. The hole-burning corresponds to the photoionization process in PSL and the hole-filling is similar to the photostimulation. Thus, the occurrence of PHB in a system is an indication of PSL, and vice versa.

Hole-burning, hole-filling, and their mechanisms in nanoparticles have been investigated by several groups. The photo-excited exciton in a nanoparticle is localized and an electron or hole is trapped at the surface of the nanoparticle. A hole or electron escapes from the nanoparticle, tunnels through the potential barrier and is trapped in the host, referring to the hole-burning process. By thermal annealing or light stimulation, the electron or hole releases and returns to the nanoparticles, essentially serving as a hole-filling. When the carriers return to the nanoparticles and recombine to give luminescence, they produce photostimulated luminescence.

In most systems, hole-burning is only observable and stable at low temperatures. Only in a few materials is hole-burning at room temperature possible. However, PSL is not dependent on temperature. For example, in a $BaFCl_xBr_{1-x}:Sm^{2+}$ system (where x>0 or x<=1), low temperature is necessary to observe PHB, while strong PSL is observed at room temperature. The hole-burning efficiency or the storage density increases by a factor of $\Gamma_I/\Gamma_H$ (where $\Gamma_H$ in the inhomogeneous line width and $\Gamma_H$ is the homogeneous line width). This ratio is highly temperature dependent. Phonon-broadening causes $\Gamma_H$ to increase with temperature and makes hole-burning difficult at high temperature. Therefore, it is necessary to conduct efficient hole-burning at low temperature. Phonon-broadening has little effect in the PSL process. Thus, it is unnecessary to work at low temperature. This is one of the advantages of nanoparticle PSL and forms the basic premise for the construction of a doped nanoparticle that exhibits PSL for use in storage devices, sensors, and optical image display systems.

Photostimulated luminescence of nanoparticles was first reported by Chen et al. (chen, Wei et al., "*Photostimulated Luminescence of Siler Clusters in Zeolite-Y*", *Physics Letters A*, vol. 232, pp. 391–394 (1997)). The UV-induced PSL shows that Ag nanoclusters formed in zeolite-Y can be used for erasable optical storage. The efficient PSL of Ag clusters in zeolite-Y is closely related to the formation of the nanoclusters and the host (zeolite) properties. The Ag nanoclusters were formed by ion-exchange in solution:

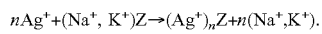
$$nAg^++(Na^+, K^+)Z \rightarrow (Ag^+)_nZ+n(Na^+,K^+).$$

Then heat treatment was carried out under vacuum and electron traps were formed as follows:

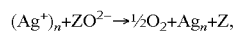
$$(Ag^+)_n+ZO^{2-} \rightarrow \tfrac{1}{2}O_2+Ag_n+Z,$$

where Z refers to the zeolite framework with a missing oxygen link. Some Lewis acid sites or oxygen vacancies are formed in the zeolite framework during the heat treatment. This is a kind of electron trap. Thus, when irradiation at 254 nm is conducted, electrons may be ionized from the clusters and trapped in the oxygen vacancies of the zeolite framework to form color centers with absorption at 840 nm:

$$Ag_n \rightarrow (Ag_n)^+ + ne,$$

$$e + Z \rightarrow \text{F-centers.}$$

When the photoionized sample is stimulated at 840 nm, the trapped electrons are released so that they return to the nanoclusters, and recombine with $(Ag_n)^+$, producing PSL as follows:

$$e + (Ag_n)^+ \rightarrow Ag_n^* \rightarrow Ag_n + 540 \text{ nm}$$

Similar results were observed in AgI nanoclusters formed in zeolite-Y by Chen et al. (Chen Wei et al., "*Photostimulated Luminescence of AgI Clusters in Zeolite-Y*", *Journal of Applied Physics*, vol. 83 iss. 7, pp. 3811–15 (1 Apr. 1998)). In this material, there are two kinds of electron traps: one in the zeolite framework and the other in the AgI nanocrystal. These two types of traps do not interfere with each other. Energy can be stored by trapping electrons at these two traps simultaneously and these levels can read separately. This, in essence, creates a "fourth dimension" for two levels of storage. Recently, PSL of $Cu^+$ from CuCl nanoparticles embedded in NaCl crystals was observed at temperatures lower than 120° K. It was suggested by the investigators that the photoionization of quantum dots and the succeeding carrier capture at the traps near the quantum dots caused the observed PSL.

The absorption and emission wavelengths of semiconductor nanoparticles are tunable via quantum size confinement. As described hereinafter, the emission wavelength of dopants in doped nanoparticles such as ZnS:Mn, ZnS:$Eu^{2+}$ are size dependent due to z size dependent electron-phonon coupling and the change of the crystal field with size. Electron-phonon coupling results in a size dependent Stokes-shift. As a result, the emission wavelength of doped ions is size dependent. Utilizing this information and phenomena leads to the materials, apparatuses and methodologies of the presently claimed and disclosed invention relating, in general, to design of nanoparticle materials with an emission that fits the detector (photomultiplier) sensitivity and with absorption that matches available lasers. Energy levels of surface states or defects are also size dependent, shifting to higher energies with decreasing size. Since the photoionized carriers are trapped in the surface states or defects, the trap depth can be tuned by size effect and, thus, control the storage time, stability and the reading light wavelength of optical storage devices, sensors, and optical imaging systems.

One of the good reasons for using nanoparticles for PSL imaging is that nanoparticles may have higher emission quantum efficiency and shorter decay lifetime than conventional bulk phosphors. Oscillator strength of the semiconductors determines the absorption cross section, recombination rate, luminescence efficiency, and radiative lifetime. The oscillator strength of the free exciton is given by:

$$f_{ex} = \frac{2m}{\hbar} \Delta E |\mu|^2 |U(0)|^2$$

where m is the electron mass, $\Delta E$ is the transition energy, $\mu$ is the transition dipole moment, and $|U(0)|^2$ represents the probability of finding the electron and hole at the same site (the overlap factor). In nanostructured materials, the electron-hole overlap factor increases largely due to the quantum size confinement, thus yielding an increase in oscillator strength. The oscillator strength is also related to the electron-hole exchange interaction which plays a key role in determining the exciton recombination rate. In bulk semiconductors, due to the extreme dislocation of the electron or hole, the electron-hole exchange term is very small, while in molecular-size nanoparticles, due to the confinement, the exchange term is very large. Thus, a large enhancement of the oscillator strength from bulk to nanostructured materials is seen. Consequently, there is a large enhancement in the luminescence efficiency.

In doped semiconductors, the excitons are bound to impurity centers. In this case, the oscillator strength is given by:

$$f = f_{ex} |\int dx F(x)|^2 / \Omega_{mol},$$

where $f_{ex}$ is the oscillator strength of the free exciton, $\Omega_{mol}$ is the volume of one molecule. The oscillator of a bound exciton is actually given by $f_{ex}$ multiplied with the number of molecules covered by the overlap of the electron and hole wave functions. Quantum size confinement also enhances the bound exciton oscillator strength in doped nanoparticles.

The radiative decay lifetime($\tau$) is closely related to the oscillator strength of a transition:

$$\tau = 4.5(\lambda_A^2 / nf),$$

where n is the refractive index, $\lambda_A$ is the wavelength. The lifetime is shortened with decreasing size due to the increase of the oscillator strength, f. The oscillator strength per unit volume, f/V (V is the volume of the cluster), determines the absorption cross section. f/V is increased upon decreasing size. Thus the absorption cross section increases with decreasing size. Thereby, the absorption intensity is increased upon decreasing size. This is good for photoionization and enhances the efficiency of the storage.

Based on the size tunability of nanoparticle properties and considering the requirements for PSL phosphors (Table-1), nanophase PSL phosphors were developed (and are hereinafter described in detail) having high efficiency and fast response. In addition, the luminescence concentration quenching is very weak in nanoparticles. Nanoparticles have no or very low scattering because their sizes are comparable with the wavelength.

TABLE 1

Considerations PSL Imaging Phosphors

| Considerations | Purposes |
|---|---|
| High Density | High absorption |
| Short luminescence lifetime | Minimum scan (readout) time |
| Low afterglow | Low image noise |
| High efficiency and brightness | Low image noise |
| Optimum stimulation spectrum | Convenient laser wavelength |
| Large stimulation cross-section (High absorption oscillator strength) | Low laser power |
| Low scattering | High imgae resolution |
| Optimum fluorescence spectrum | Detector sensitivity |
| Dose linearity | Signal reliability |
| Erasure and reusability | Low cost |

They are easy to produce at low temperature. All of these benefits of nanoparticle PSL phosphors indicates, and the following data confirms, that efficient PSL storage phosphors with high density and low cost, which are beneficial for practical applications, are possible and, were indeed, produced and are enabled herein.

As described hereinafter, the photoluminescence and PSL of Ag and AgI nanoclusters formed in zeolite-Y were studied using fluorescence spectroscopy. The photoluminescence spectra of AgI nanoclusters show emission from both AgI and Ag nanoclusters, although using PSL only the emission of Ag clusters is observed. While the photoluminescence from both Ag and AgI particles displays both sub-nanosecond and microsecond lifetimes, the emission from PSL results in very short, picosecond lifetimes. The strong PSL with short decays in nanoparticles doped with rare earth ionss and transition ions, such as Eu2+, Ce3+, Ag+, and Cu+ etc., are useful in digital storage, sensor and medical radiology applications.

Silver and silver halide (AgX) clusters are well studied due to their applications in photography where the absorption of light results in the formation of small Ag clusters at the surface of the halide microcrystal. These clusters then catalyze the reduction of the entire AgX microcrystal during the development process. In addition, silver and silver complexes encapsulated in zeolites are shown herein as photocatalysts for a variety of reactions, and as a medium for optical storage. Thus, small clusters of these materials, such as nanoparticles, may have unique advantages for photosensitive applications. Both Ag and AgI nanoparticles encapsulated within zeolite-Y are shown herein to exhibit strong PSL.

Additionally, nanoparticles of BaFBr:$Eu^{2+}$ exhibiting strong PSL with faster decays than that of bulk BaFBr:$Eu^{2+}$ are contemplated for use. Nanoparticles of ZnS:$Ag^+$, ZnS:$Cu^+$ and ZnS:$Eu^{2+}$ may also be used for PSL storage. Hereinafter, we describe their PSL and storage behaviors.

Due to quantum size confinement, the luminescence efficiency in nanophase materials may be enhanced relative to bulk materials. In addition, the luminescence wavelength is tunable with size. Light scattering is significantly reduced in nanoparticles compared with micron-sized particles, since the light scattering intensity is proportional to the $6^{th}$ power of the particle size. Therefore, nanophase materials represent an efficient PSL phosphor for X-ray storage. The phenomenon of PSL from nanoparticles has recently been reported by several groups. Herein claimed and described are PSL dynamics from both Ag and AgI nanoparticles encapsulated in zeolite-Y. The results show a significant reduction in the lifetime of the PSL relative to the normal photoluminescence (PL) in both particles.

The preparation of Ag and AgI clusters in zeolite-Y (henceforth Ag/Y and AgI/Y) has been reported by Chen et al. (Chen, Wei et al., "*Photostimulated Luminescence of Silver Clusters in Zeolite-Y*", Physics Letters A, vol. 232, pp. 391–394 (1997)), and Chen et al. (Chen Wei et al., "*Photostimulated Luminescence of AgI Clusters in Zeolite-Y*", Journal of Applied Physics, vol. 83 iss. 7, pp. 3811–15 (1 Apr. 1998U), each of which is expressly incorporated herein by reference in its entirety and one of ordinary skill in the art, given these references, would be capable of preparing the Ag/Y and AgI/Y. In particular, $Ag^+$ ions were first exchanged into the cages of the zeolite. The zeolite powder was slurried in deionized water with the acidity adjusted to pH 6 with nitric acid. Silver nitrate was added and the mixture was stirred at room temperature for 2 hours. The $Ag^+$ ion-exchanged zeolite was collected by filtration and then washed with deionized water until $Ag^+$ was not detected in the filtrate. Ag clusters were formed in the zeolite cavities by vacuum heat treatment at 250° C. in the dark. To prepare AgI clusters, the resulting $Ag^+$ ion-exchanged zeolite powder was slurried in a sodium iodide solution by stirring at 100° C. for 2 hours, after which the materials were collected by filtration and washed extensively with deionized water and finally dried and calcined at 250° C. in the dark and under vacuum for 2 hours. It has been previously shown in the art that these particles are between 1 and 2 nm in size, which corresponds well with the size of the sodalite cages of the zeolite.

The photoluminescence and PSL spectra were recorded on a SPEX FLUOROLOG™ 3 (obtainable from Jobin Yvon, Ltd. located in the United Kingdom) fluorescence spectrophotometer. A pulsed nanosecond optical parametric oscillator/amplifier (OPO) (Spectra-Physics MOPO-730) operating at a 10 Hz repetition rate was used to collect the PL lifetime data. The output of the OPO was frequency doubled in Potassium Dihydrogen phospate (KDP) to produce the PL excitation light. The excitation light was directed onto the particles and emission was collected and focused into a ⅛ meter monochromator equipped with a standard photomultiplier tube. The photomultiplier tube output was directed into a digital oscilloscope to record the emission decays. The response time of the system was measured to be about 15 ns FWHM.

The PSL lifetimes were too short to be measured with the nanosecond OPO system. In this case, excitation was provided by the output of a femtosecond regeneratively amplified titanium:sapphire laser system operating at 1 kHz. The 150 fs pulses of this laser at 800 nm and 200 microjoules were directed onto the particles and the emission was collected and focused into a streak camera (Hamamatsu C5680). Suitable bandpass and cutoff filters were used to collect the luminescence at different wavelengths. The time resolution was determined to be about 14 ns full width at half maximum (FWHM).

Figure 3:
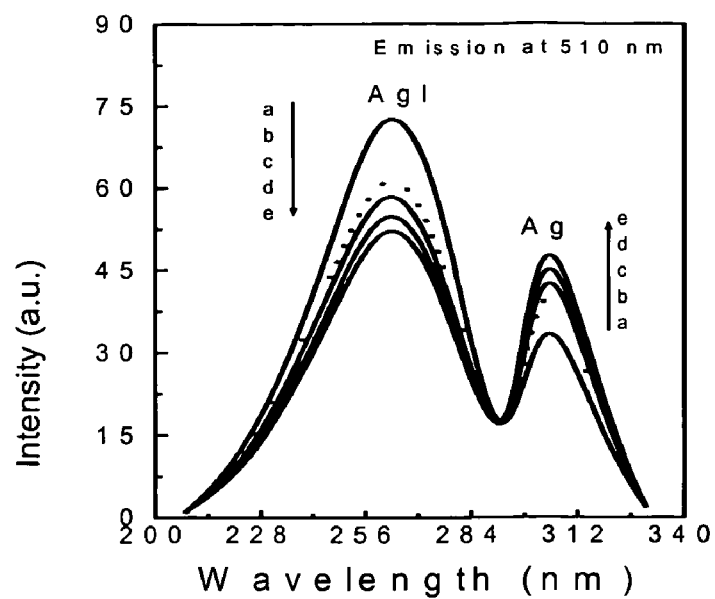
FIG. 3 is a graphical representation showing photoluminescence excitation (PLE, emission at 407 nm) and emission photoluminescence (PL, excitation at 304 nm) spectra of BAFBr:$Eu^{2+}$ nanoparticles.

AgI nanoclusters encapsulated in zeolite-Y show strong luminescence and photostimulated luminescence at room temperature. FIG. 3 displays the excitation spectra of AgI/Y particles when monitoring an emission wavelength corresponding to the emission maximum of Ag particles (~510 nm). The excitation peak at 265 nm is due to AgI nanoclusters, while the excitation peak at 305 nm results from Ag nanoclusters. Under UV radiation at 254 nm, the intensity of the AgI peak decreases, while the intensity of the Ag peak increases. The AgI/Y emission intensity recovers under subsequent illumination using a visible source. Since silver halides are known to produce metallic Ag clusters upon irradiation it is not surprising to find significant Ag particle luminescence from the AgI/Y particles. In addition, Ag is known to co-exist with AgI in zeolite-Y, therefore PL from Ag clusters is observed in AgI/Y particles even in non UV-irradiated samples.

Figure 4:
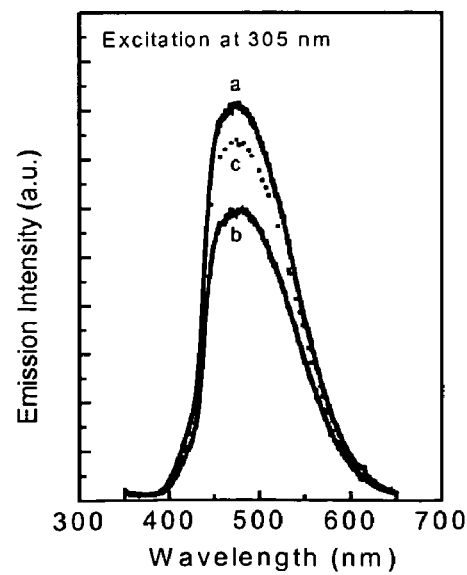
FIG. 4 is a graphical representation of the emission spectra of BaFBr:$Eu^{2+}$ nanoparticles before (1) and after UV irradiation at 254 nm for 3 (2), 5 (3), 10 (4), and 15 (5) minutes, respectively with the excitation at 304 nm.

FIG. 4 shows the PL spectra of AgI/Y following excitation at 305 nm (the peak of the Ag nanocluster absorption). The broad emission band consists of two sub-bands: the first results from AgI nanoparticle emission peaking at 474 nm, and the second results from Ag nanocluster emission centered at 510 nm. The luminescence decreases in intensity when the sample is irradiated by ultraviolet light at 254 nm. This decrease can be partially recovered by exposing the sample to visible light. When AgI/Y particles are excited at 275 nm (near the peak of the AgI absorption), there is a noticeable red shift in the PL spectrum relative to excitation at 305 nm.

Figure 5:
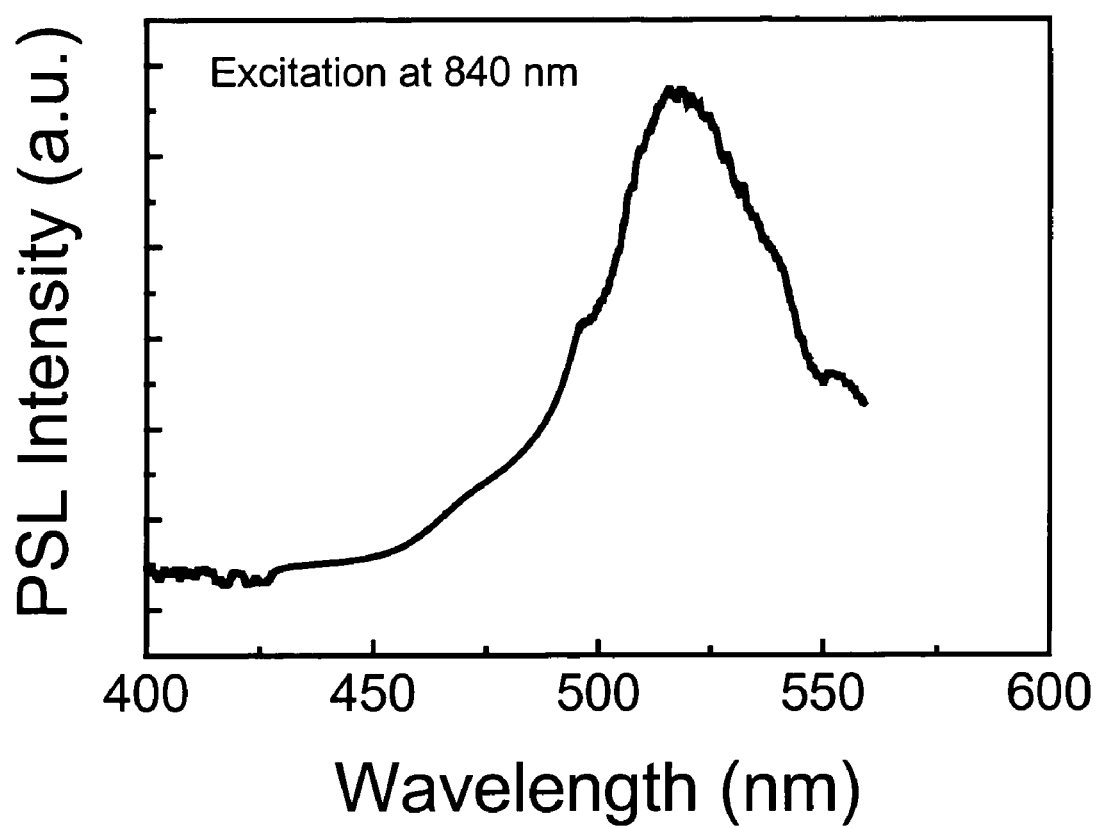
FIG. 5 is a graphical representation of 304 nm excited photoluminescence (PL) and 600 nm stimulated PSL spectra of BaFBr:$Eu^{2+}$ nanoparticles after UV irradiation for 10 minutes, respectively.

After a few minutes of UV irradiation, strong PSL can be detected from AgI nanoparticles in zeolite-Y as shown in FIG. 5. PSL excitation is easily stimulated using near infrared wavelengths. FIG. 5 shows that the emission consists almost exclusively of Ag nanoclusters resulting in a narrower band than the PL emission band, and the PSL emission band is red-shifted from the PL emission band.

Figure 6:
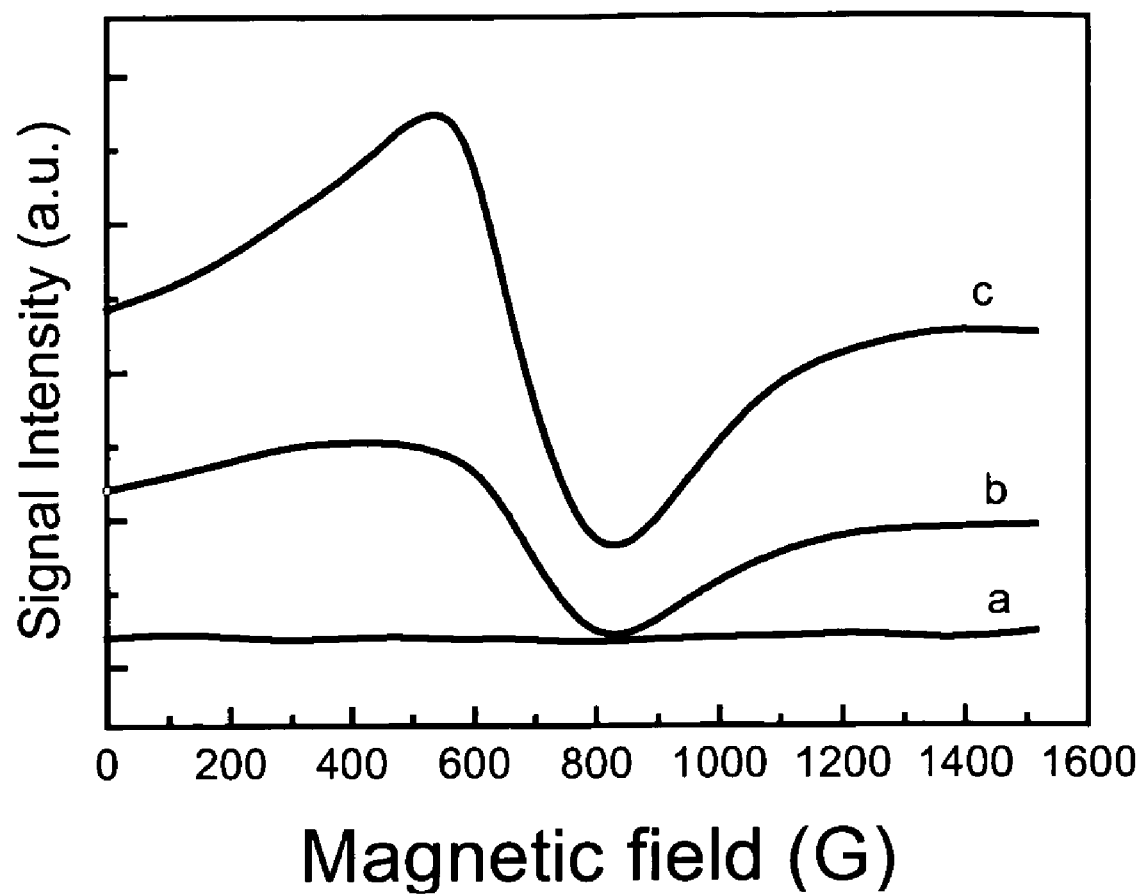
FIG. 6 is a graphical representation of PSL decays of bulk and BaFBr:$Eu^{2+}$ nanoparticles excited at 560 nm.

Additionally, after UV irradiation, an electron spin resonance signal is detected (as shown in FIG. 6). The g-value (2.002) of this signal is close to that of the F-center (2.0023), indicating that the signal is from electron centers created either in the zeolite matrix or else in the nanoparticles themselves. These color centers are the source of the electrons released during the PSL process.

Figure 7:
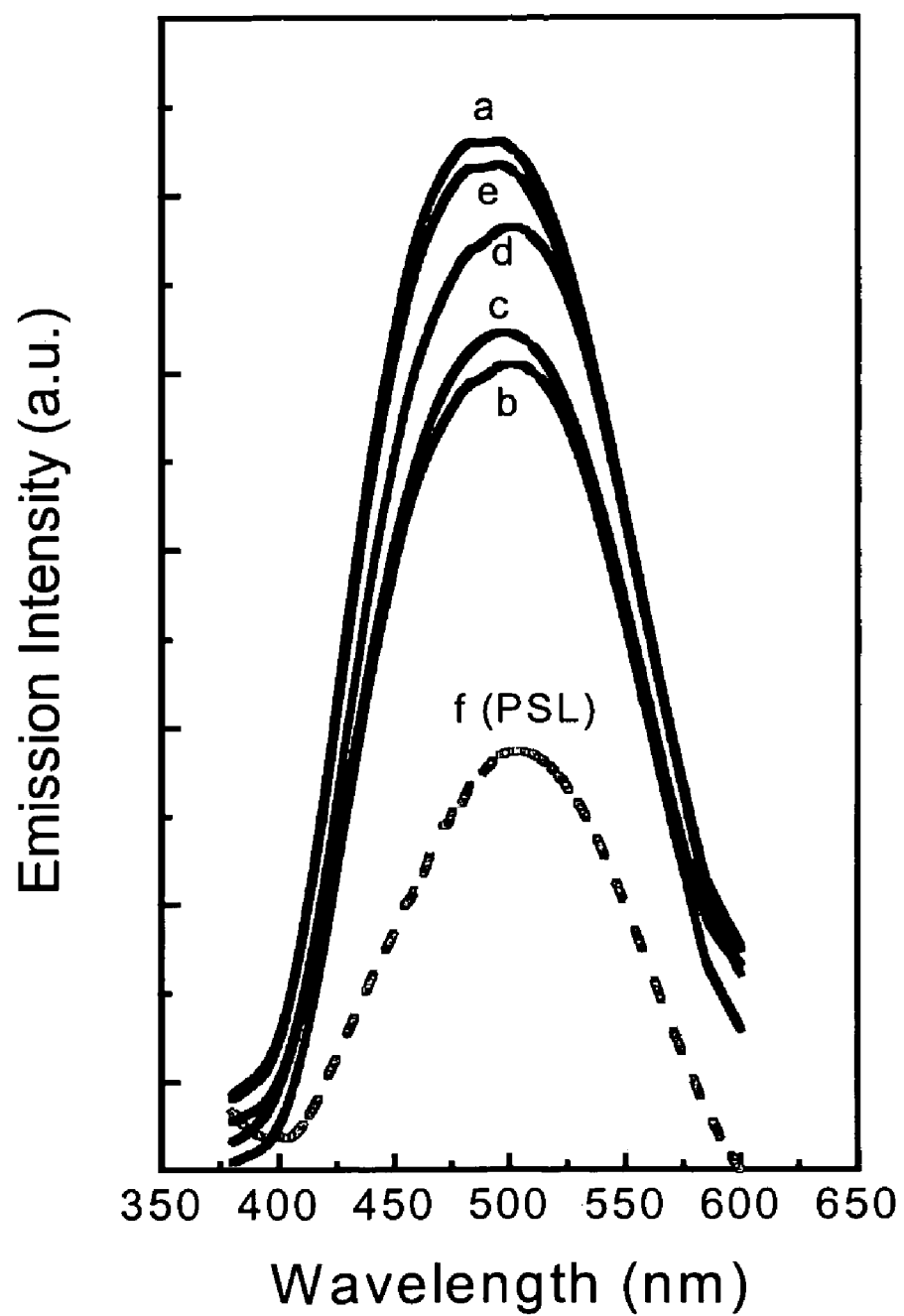
FIG. 7 is a graphical representation showing fluorescence excitation spectra of AgI/Y before (a) and after UV irradiation at 254 nm for 5 (b), 8 (c), 11 (d), and 15 minutes (e) respectively.

Similarly, Ag nanoclusters in zeolite-Y are photosensitive and exhibit strong photostimulated luminescence. FIG. 7 shows the emission spectra of Ag/Y particles following excitation at 310 nm. We observe that under UV irradiation at 254 nm for 10 minutes, the luminescence intensity decreases significantly (FIG. 7, line "b"). The luminescence increases in intensity slightly when the sample is then irradiated at 840 nm (FIG. 7, line "c"). The luminescence increases further by exposure to a 650 nm light for 10 minutes. (FIG. 7, line "d"). The luminescence is almost back to its original intensity after exposing to a visible lamp for an additional 20 minutes (FIG. 7, line "e"). After UV irradiation, strong photostimulated luminescence is observed from Ag nanoclusters, which is shown in FIG. 7, line "f". As in AgI/Y particles, the PSL spectrum is slightly shifted to a longer wavelength from the photoluminescence spectrum of the clusters. Similar to AgI/Y, Ag/Y particles show a decrease in PL after UV irradiation. This decrease is almost completely reversible following irradiation by light between 650 and 900 nm. Thus, both materials can be used as reusable image or digital storage media.

Figure 8:
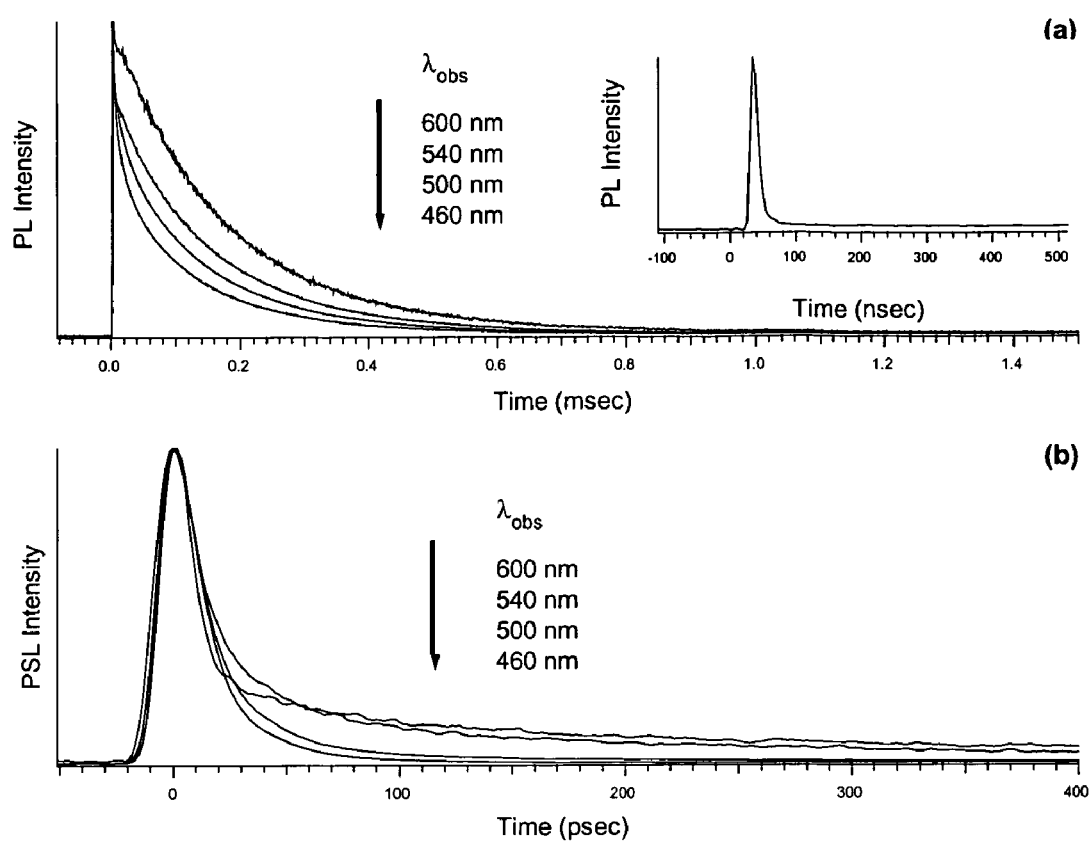
FIG. 8 is a graphical representation showing photoluminescence spectra of AgI/Y before (a) and after (b) UV irradiation at 254 nm for 5 minutes. After exposure to a visible lamp for 5 minutes (c).
Figure 9:
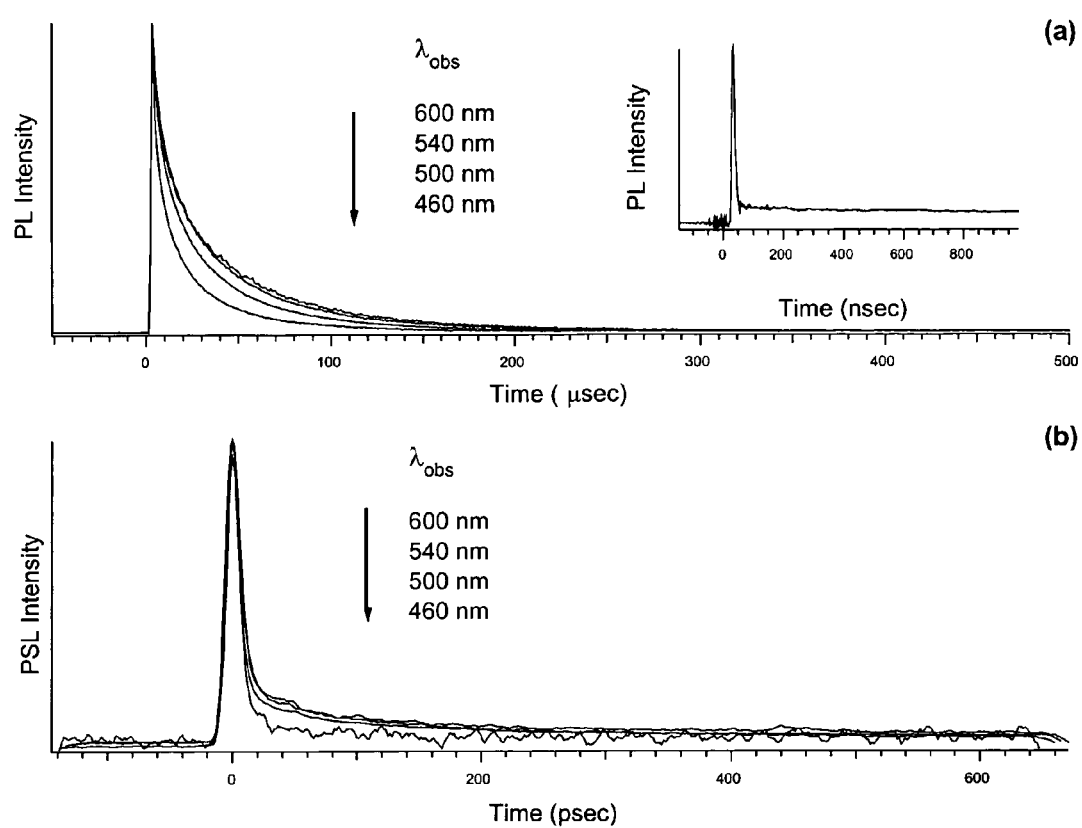
FIG. 9 is a graphical representation showing PSL spectra of AgI/Y after UV irradiation at 254 nm for 10 minutes and thereafter excitation at 840 nm.

The PL and PSL decay lifetimes of AgI/Y are shown FIGS. 8(a–b). PL and PSL luminescence lifetimes from Ag/Y particles are shown in FIGS. 9(a–b) for comparison. The insets show PL spectra taken with higher time resolution and show the existence of two time regimes. The first is very fast, less than the instrument response of 15 ns. The second regime is on the order of microseconds. Both the fast and slow lifetime components are observed at all emission wavelengths.

The microsecond PL lifetimes and PSL lifetimes from both particles show multi-exponential behavior at all combinations of emission and excitation wavelengths. However there are some very clear trends which are summarized below and in Table II:

PL from both Ag/Y and AgI/Y show both fast (<15 ns) and slow (microsecond) components at all emission wavelengths following excitation at either 275 nm or 305 nm.

For both Ag/Y and AgI/Y particles, the slow PL decays are noticeably shorter at blue emission wavelengths than for red emission following excitation at either wavelength. In addition, the PL lifetime from Ag/Y particles is about 3 times faster than that from AgI/Y particles. The longer time component ranges from about 50 to 80 microseconds in Ag/Y particles while in AgI/Y nanoclusters, the lifetime ranges from 175 to about 200 microseconds, depending on monitored emission wavelength.

The PSL lifetimes from both Ag and AgI show only fast components. One component is instrument limited (<14 ps) while the other varies between 50 picoseconds and 800 picoseconds depending on sample and emission wavelength. The very fast, instrument-limited luminescence may be due to extremely fast trapping of the excited electron as has been observed in colloidal AgI nanoparticles.

The PSL lifetimes are shorter for blue emission wavelengths relative to the red emission wavelengths for both Ag and AgI particles. In addition, PSL lifetimes for Ag/Y particles are longer than the corresponding lifetimes for AgI/Y particles. For Ag/Y particles the longer component varies from 160 ps at 460 nm to 830 ps at 600 nm. In AgI/Y particles, this decay component ranges between 90 ps at 460 nm to about 200 ps at 600 nm.

TABLE II

PL and PSL lifetimes of Ag/Y and AgI/Y nanoparticles. Values shown are the longest decay components of a multi-exponential fit. Errors ± 10%.

| Emission (nm) | Ag/Y Particles | | AgI/Y Particles | |
|---|---|---|---|---|
| | PL Lifetime[a] | PSL Lifetime[b] | PL Lifetime[c] | PSL Lifetime[b] |
| 460 nm | 50 µs | 160 ps | 175 µs | 90 ps |
| 500 nm | 65 µs | 320 ps | 185 µs | 125 ps |
| 540 nm | 67 µs | 670 ps | 191 µs | 170 ps |
| 600 nm | 80 µs | 830 ps | 208 µs | 190 ps |

[a]Excitation at 305 nm.
[b]Excitation at 800 nm.
[c]Excitation at 275 nm

Any model proposed to explain these results must, at a minimum, explain the following observations: (1) Photoluminescence from Ag particles is observed following excitation at the absorption maximum of AgI in AgI/Y particles, (2) The observed photostimulated luminescence spectrum from AgI/Y particles is composed almost entirely of luminescence from Ag particles, (3) Despite the fact that Ag is a metal and AgI a semiconductor, the PL and PSL lifetimes from both particles are remarkably similar, and (4) in the PL lifetime data of both particles, there are two distinct time regimes, while in the PSL lifetime data, there is only a fast component.

Shortened PSL lifetimes relative to PL lifetimes have been observed previously. In CaS:Eu, Sm phosphors, the PSL decay time of $Eu^{2+}$ is less than 14 ps, which is much shorter than the spontaneous emission lifetime of $Eu^{2+}$. Similar results have been observed in $SrAl_2O_4:Eu^{2+}, Dy^{3+}$, where a factor of three reduction in the PSL versus the PL lifetimes has been observed. In the above cases this lifetime shortening has been explained as resulting from 1) fast retrapping, 2) lattice relaxation, 3) by resonant energy transfer or 4) rearrangement of the $Eu^{2+}$ levels.

Ag photoluminescence from AgI/Y particles has been observed previously. An 'autoreduction' mechanism has been invoked to explain the appearance of Ag along with AgI in these nanoclusters. That is, the zeolite acts to reduce silver cations incorporated in the zeolite cages during the nanoparticle fabrication process. In addition, irradiation of AgI is known to produce small Ag clusters on the surface and our PL results on AgI/Y indicate that UV irradiation produces an increase in Ag luminescence concurrent with a decrease in the AgI luminescence. Therefore, it appears that there are small Ag clusters likely on the surface of the AgI particles. Excitation of AgI results in luminescence from Ag particles reveals that energy transfer takes place between the two species as has been observed previously. The close proximity of the two moieties would facilitate such transfer. Similar results have been reported for nanoscale silver oxide.

FIG. 5 demonstrates that PSL from AgI/Y particles is dominated by the luminescence from Ag particles. In addition, both systems show extremely fast PSL decay times. Although these decay times differ by about a factor of 3, they do not show the large differences that are expected given that Ag is a metal while AgI is a direct bandgap semiconductor. The differences in PL and PSL lifetimes may well reflect the different energetics between the two, but these differences are not extremely pronounced. In addition both particles show identical PL and PSL lifetime behavior, i.e. both fast and slow components in the PL versus only a fast component in the PSL. These observations lead to the conclusion that the PSL photophysics within AgI/Y particles is primarily determined by Ag clusters on the surface of the AgI nanoclusters.

The PL lifetimes from both particles show multi-exponential behavior with two very distinct time regimes, a fast (<15 ns) and a slow (50–100 microsecond) timescale. Thus, there are two distinct subsets either of Ag or AgI particles, or environments within the zeolite sample. There are many possible explanations for the existence of these two time regimes. (i) The fast decay may be a result of differences in the strength of the transition moment of some species relative to others. This could be the result of stronger interaction with the zeolite. (ii) One subset may be from clusters within the sodalite cages, while the other is from clusters within the supercages of the zeolite. Interactions between the Ag or AgI moiety and the different cage types of the zeolite could result in two distinct subsets. (iii) There could be two different sizes or conformations of clusters within the cages, for instance, one with a smaller number of atoms (molecules), and one with a larger number. (iv) One subset may have an extremely efficient non-radiative decay pathway available relative to the other species. Coupling to trap states in the zeolite or trapping of the excitations within the nanoparticle could account for the fast decay. The slower decay would then be from a subset of particles which have either different configurations or environments such that efficient trapping does not occur.

In order to sort out such possibilities, it must be noted that the size of the particles is consistent with formation only within the smaller sodalite cages, no evidence of larger nanoclusters residing in the supercages is present. Therefore, it is unlikely that (ii) is correct. Matrix isolated Ag clusters are known to have different absorption and emission spectra depending on size and conformation. If different sizes or conformations produced the two distinct subsets, it would be expected to find that some PL emission wavelengths would have all or mostly the fast decay component and other wavelengths mostly the slow component. Both components exist at all emission wavelengths, indicating that selective emission based on cluster size or conformation is unlikely to be the causative factor. This casts doubt on explanation (iii). Previous optical measurements of Ag clusters in zeolites have noted that the spectra are similar to Ag clusters in rare-gas matrices. These interactions are considered weak and therefore it is unlikely that such interactions would lead to a drastic change in the electronic transition moment. Therefore, explanation (i) may be ruled out as well. The only conclusion left is that the fast time decay arises from a subset of species that couple to efficient trap sites, either within the nanocluster themselves, or within the zeolite framework. Short excited state lifetimes have been observed in AgI colloidal nanoparticles by femtosecond transient absorption. These short lifetimes have been related to trapping and non-radiative electron-hole recombination within the nanoparticles.

Figure 10:
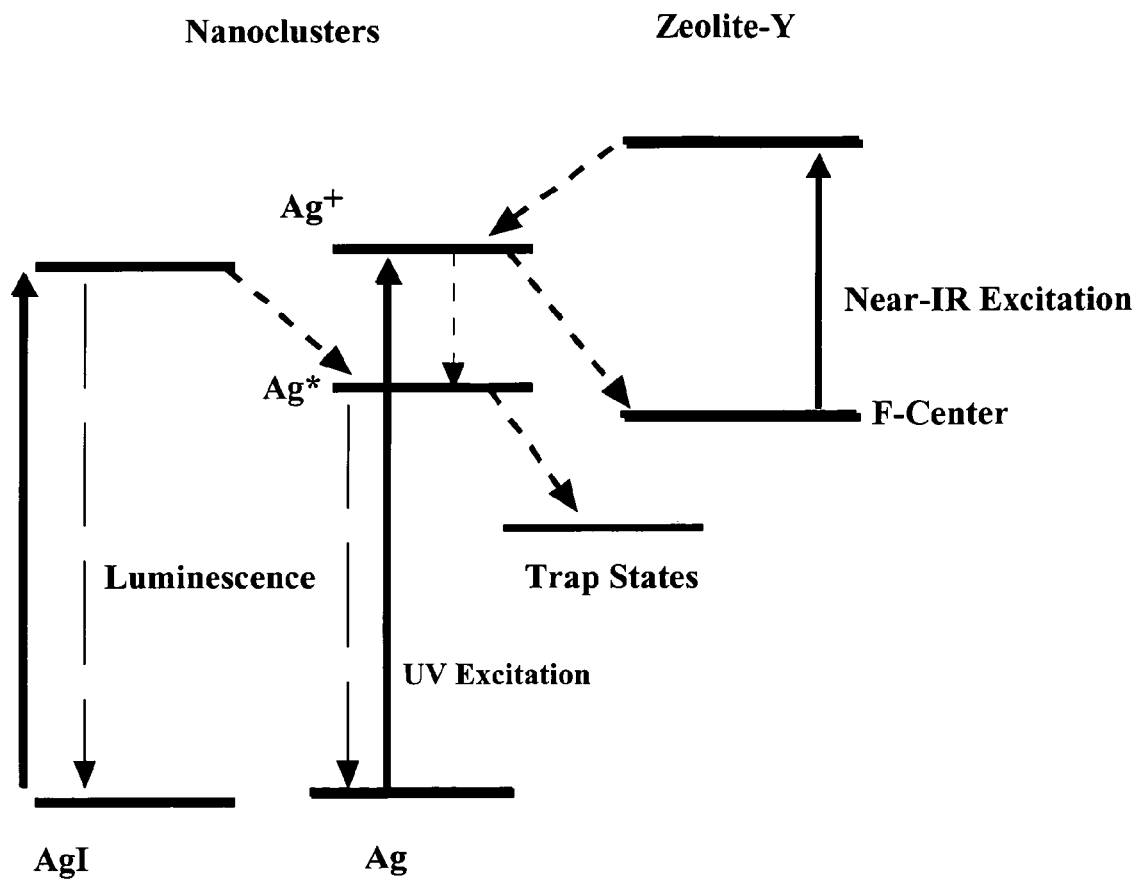
FIG. 10 is a graphical representation showing electron spin resonance of AgI/Y before (a) and after UV irradiation at 254 nm for 8 minutes (b) and 15 minutes (c), respectively.

Trapping to states within the zeolite serves to shorten the observed lifetimes. Efficient electron trapping in the zeolite must occur in order to observe the PSL. In addition, trapping occurs at other sites both within the zeolite or the nanoclusters. A model that explains the nature of these trap sites and ultimately provides a reasonable explanation of the observed photophysics is set forth herein (FIG. 10). In order to understand the observed results, consideration must be given to the likely geometrical and chemical distribution of both Ag and AgI clusters within the zeolite. After ion-exchange, $Ag^+$ cations are encapsulated into the zeolite cages. In the formation of AgI nanoclusters, reaction with $I^-$ anions produces AgI nanoclusters in the zeolite cages, while there are still some $Ag^+$ ions that coexist along with the AgI clusters. In either case, the $Ag^+$ ions are 'autoreduced' to $Ag^0$ when the samples are heated in vacuum according to the following reaction:

$$4Ag^+ + 2ZO^{2-} \rightarrow O_2 + 4Ag^0 + 2Z,$$

where $ZO^{2-}$ represents a zeolite framework, and Z represents a zeolite framework with a missing oxygen link (oxygen vacancy), i.e. with a Lewis acid site. The autoreduced Ag is most likely in close proximity and coupled to the Lewis acid site forming an Ag:zeolite complex at the interface.

The near-UV photons used herein are not capable of generating free electrons and holes in the zeolite framework. Hence, $Ag^0$ is ionized to $Ag^+$ by UV irradiation ($Ag^0 \rightarrow Ag^+$) leading to both a source of electrons and a luminescent center, $Ag^+$. The ionized electron is captured in Lewis acid sites (oxygen vacancies) that are the acceptors of electrons and/or in trap states of AgI or Ag nanoclusters. These electron centers are likely responsible for the electron spin resonance (ESR) signal. The trapped electrons in the zeolite Lewis acid sites produce the F-center near infrared absorption required to stimulate PSL. Upon further irradiation with low energy photons, these electrons are released and may recombine with the $Ag^+$ centers through either tunneling or through the conduction band. The photo-released electron may also recombine with $Ag^+$ to give the emission of $Ag^0$ as follows:

$$e + Ag^+ \rightarrow Ag^{0*} \rightarrow Ag^0 + h\lambda,$$

where $e$ represents electrons released from the color center, $Ag^{0*}$ is the excited state of Ag cluster, and $Ag^0$ is the ground electronic state after emitting the photons ($h\lambda$). As a result, in either AgI/Y or Ag/Y particles, only PSL from Ag particles is observed. Thus the PSL originates from the Ag:zeolite complex at the interface of the nanoparticles and the zeolite. Likewise, recent results of PSL from BaFBr:$Eu^{2+}$ phosphors indicate that the PSL originates at interfaces defined by grain boundaries and dislocations. The subnanosecond PL lifetime component also originates from this complex.

Not all Ag clusters will reside near a Lewis acid site in the zeolite, however, nor is it likely that all AgI/Y particles have Ag clusters associated with them. Those clusters that do not have access to this efficient electron trap will upon irradiation, display the longer (microsecond) lifetime decays similar to that reported for AgBr nanoparticles. However, those clusters of either Ag or AgI particles that have an Ag particle in close association with a Lewis acid site will have an extremely short lifetime, and become the luminescent center upon photostimulation. In addition, there may exist other trap sites within the zeolite and migration may occur between them as has been previously described. The existence of additional trap sites and transfer between them only serves to shorten the lifetime further. This mechanism is similar to one described to explain PSL in a number of x-ray storage materials. In the instant application, PSL complexes are formed which have the active luminescent center and electron trap in close proximity. Tunneling serves to connect the two species. Herein, the $Ag^+$-Z site serves as a PSL complex where excitation of the electron from its trap within the zeolite results in transfer to the $Ag^+$ center.

In addition to the fast and slow regimes evident in the lifetime data, there is significant lifetime decay dispersion with respect to emission wavelength in both the PL and PSL.

In both cases, red emission wavelengths have slower lifetime decays than the blue wavelengths. This can be explained by noting that small Ag clusters have different absorption and emission wavelengths depending on size and geometry. Sodalite cages in zeolite-Y are on the order of 1.3 nm, therefore only small Ag and AgI clusters fit inside. Therefore, a distribution of small cluster sizes or conformations within the cages is likely. Such inhomogeneity results in multi-exponential decay lifetimes as well as the dispersion of the lifetimes with wavelength. Thus, red emission wavelengths probe different sizes or conformations of the clusters relative to others. The fact that the PSL spectra from both particles is red-shifted from the PL is a result of certain cluster sizes or conformations being more efficiently coupled to the zeolite oxygen vacancies.

PSL from AgI/Y particles is qualitatively stronger than PSL from the Ag/Y particles. The PSL lifetimes are also shorter in AgI/Y compared to Ag/Y. Thus, AgI/Y may be a better material for x-ray storage relative to Ag/Y. However, short lifetimes and strong PSL make both of these materials good candidates for phosphor screens because of the significantly enhanced readout rates possible. These materials are also useful for digital storage applications as described hereinafter in detail.

Strong PL and PSL are observed from Ag and AgI nanoclusters formed in zeolite-Y. The PL lifetimes demonstrate the existence of two subsets of nanoparticles, one with a long (microsecond) lifetime and the other with a much shorter, sub-nanosecond lifetime. In contrast, PSL lifetimes show only a fast, picosecond lifetime. The origin of the photostimulated luminescence is ascribed to the formation of a PSL complex between interfacial $Ag^+$ and Lewis acid sites in the zeolite in close proximity, while the PL originates from both the PSL complex and from nanoparticles which are not strongly coupled to the zeolite oxygen vacancies. The strong photostimulated luminescence with short decay lifetime demonstrates that nanoparticles are useful as digital storage mediums, sensors, and medical radiology.

The photostimulable phosphor used in commercial X-ray imaging system is $BaFBr:Eu^{2+}$. Yet, the $BaFBr:Eu^{2+}$ system suffers from poor resolution due to the long decay lifetime of $Eu^{2+}$ emission (0.8 µs) as well as scattering of the stimulating laser light from the plate-like polycrystals. Quantum size confinement of nanoparticles overcomes some of these problems. The higher luminescence efficiency, faster decay and lower light-scattering for smaller particles results in higher spatial resolution and faster response. Strong PSL from $BaFBr:Eu^{2+}$ nanoparticles with a decay lifetime of 390 ns provides a good example demonstrating that the PSL imaging performance and resolution is improved via quantum size confinement.

Nanosized $BaFBr:Eu^{2+}$ phosphors were made and a strong PSL is observed from these $BaFBr:Eu^{2+}$ nanoparticles. These $BaFBr:Eu^{2+}$ nanoparticles were made as follows.

The preparation of the $BaFBr:Eu^{2+}$ nanoparticles was based on the following reaction in acid solutions:

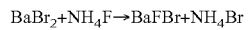

$$BaBr_2 + NH_4F \rightarrow BaFBr + NH_4Br$$

In order to control the reaction rate, stabilizers (e.g., poly(vinyl alcohol)) were added to the solution and the reaction temperature was controlled. The following methodology was used to make the BaFBr:Eu nanoparticles:

A four-neck flask was filled with 400 mL deionized water and 4 g poly(vinyl alcohol) and was stirred under $N_2$ for 1 hour. The pH value was adjusted to 2 by the addition of nitric acid.

4.83 g $BaBr_2 \cdot 2H_2O$ and 0.137 g $EuI_2$ were added to the solution and stirred under $N_2$ for 1 hour at room temperature.

0.70 g NaF was added to the solution and stirred under $N_2$ for 0.5 hours at room temperature until precipitation occurred.

The temperature was raised to 80° C., the reaction was sustained for 2 hours and then, cooled rapidly to room temperature.

The nanoparticles were separated from solution by centrifugation, washed with dionized water, and dried in vacuum at room temperature.

The powder was heated at a temperature lower than 450° C. in carbon monoxide or in an $N_2$ atmosphere for 0.5 hour.

Figure 11:
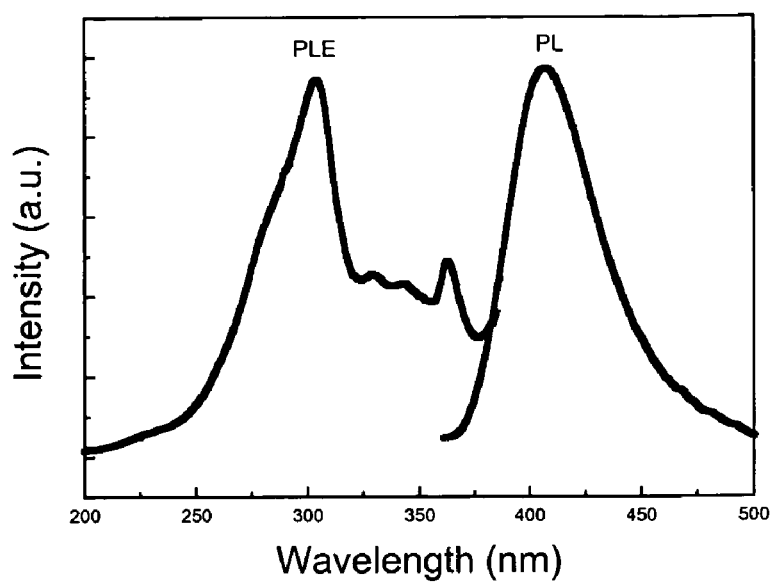
FIG. 11 is a graphical representation showing the 310 nm excited photoluminescence spectra of Ag/Y before (a), and after UV irradiation at 254 nm for 10 minutes (b), then exposure to a 840 nm light for 10 minutes (c), then a 650 nm light for 10 minutes (d), and then to a visible lamp for 10 minutes (e). Trace (f) is the photostimulated luminescence spectrum stimulated at 840 nm.

FIG. 11 shows the excitation and emission spectra of $BaFBr:Eu^{2+}$ nanoparticles having an average size of ~40 nm, as measured by X-ray diffraction. The emission band is due to the transition of $4f^65d^1(t_{2g}) \rightarrow 4f^7$ of $Eu^{2+}$. It is found that in $BaFBr:Eu^{2+}$ nanoparticles, the emission band of $Eu^{2+}$ is at 407 nm, which is ~17 nm red-shifted compared to that in bulk $BaFBr:Eu^{2+}$ at 390 nm. This is due to the change in crystal field or site symmetry of the nanoparticles. Furthermore, it is found that in bulk $BaFBr:Eu^{2+}$, only one excitation peak is observed, while in $BaFBr:Eu^{2+}$ nanoparticles, four peaks appear in the excitation spectra.

Figure 12:
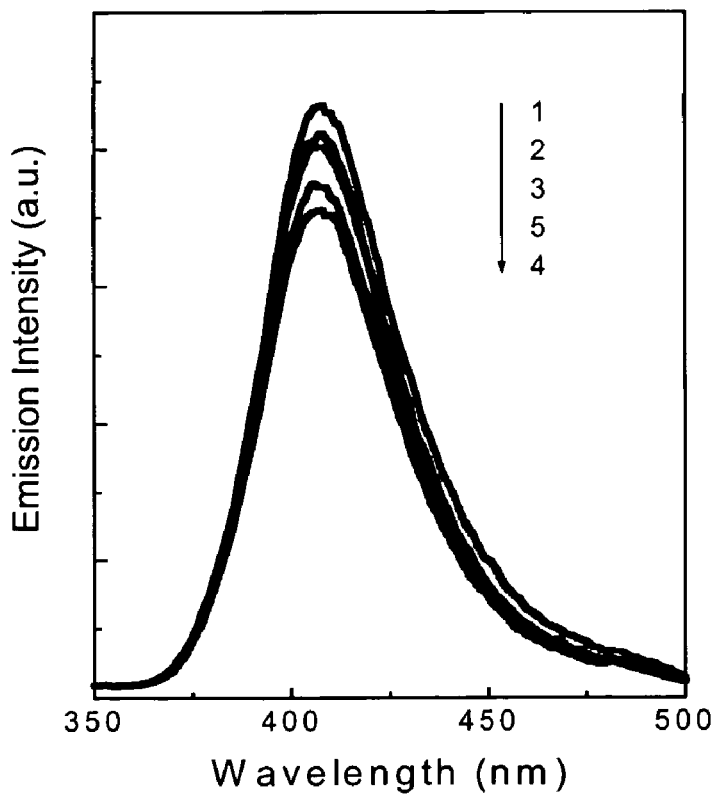
FIG. 12 is a graphical representation showing lifetime decays of (a) photoluminescence (excitation at 305 nm) and (b) photostimulated luminescence (excitation at 800 nm) in AgI/Y nanoparticles. The inset in (a) displays the PL lifetime at higher time resolution showing the fast (<15 ns) time component.
Figure 13:
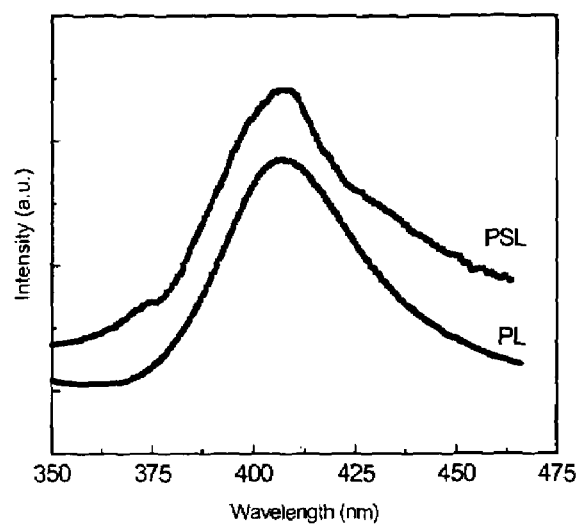
FIG. 13 is a graphical representation showing lifetime decays of (a) photoluminescence (excitation at 305 nm) and (b) photostimulated luminescence (excitation at 800 nm) in Ag/Y nanoparticles. The inset in (a) displays the PL lifetime at higher time resolution showing the fast (<15 ns) time component.

The fluorescence of $BaFBr:Eu^{2+}$ nanoparticles is very sensitive to light. Under UV irradiation, the luminescence of $Eu^{2+}$ decreases in intensity as shown in FIG. 12. The luminescence recovers by exposure to red light at approximately 600 nm. Strong PSL is observed by stimulation at 600 nm, which is shown in FIG. 13. The PSL spectrum is consistent with the PL spectrum. This indicates that the PSL is from the recombination of electrons with $Eu^{2+}$ centers as in bulk $BaFBr:Eu^{2+}$ phosphors.

Figure 14:
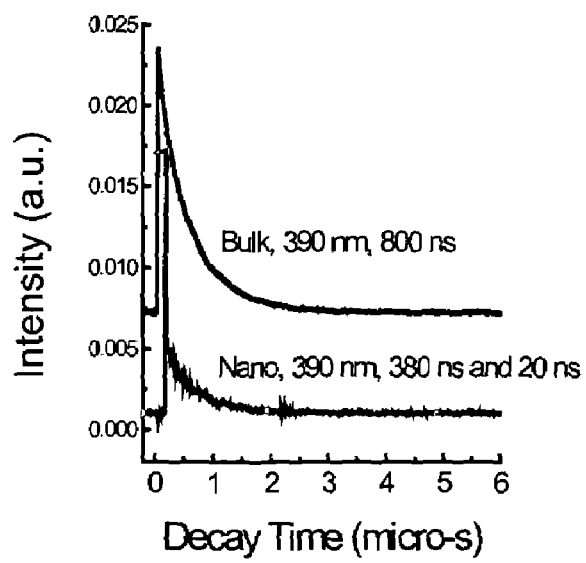
FIG. 14 is a schematic representation of the energy levels of the photophysical processes in Ag/Y and AgI/Y nanoparticles. Solid lines represent photon excitation, dashed lines represent luminescence, and dotted lines represent energy transfer between levels.

FIG. 14 shows the PL and PSL decays of $BaFBr:Eu^{2+}$ nanoparticles in comparison with that of bulk $BaFBr:Eu^{2+}$ phosphor. The results demonstrate that the PL decay lifetime of $BaFBr:Eu^{2+}$ nanoparticles is almost the same as that of bulk $BaFBr:Eu^{2+}$, around 800 ns. However, the PSL decay lifetime of $BaFBr:Eu^{2+}$ nanoparticles is much shorter than that of bulk $BaFBr:Eu^{2+}$. The PSL decay of $BaFBr:Eu^{2+}$ nanoparticles has two components, one is shorter than 20 ns, the other is 340 ns. The short decay of less than 20 ns appears to be due to the surface states and the decay of 340 ns appears to be due to the quantum confinement. The difference in the PSL decay behavior of the nanoparticles and the bulk material indicates that the PSL processes in the bulk and the nanoparticles is different. The faster decay in the nanoparticles demonstrates that it is possible to improve the storage and imaging performance by quantum size confinement of nanotechnology.

Figure 15:
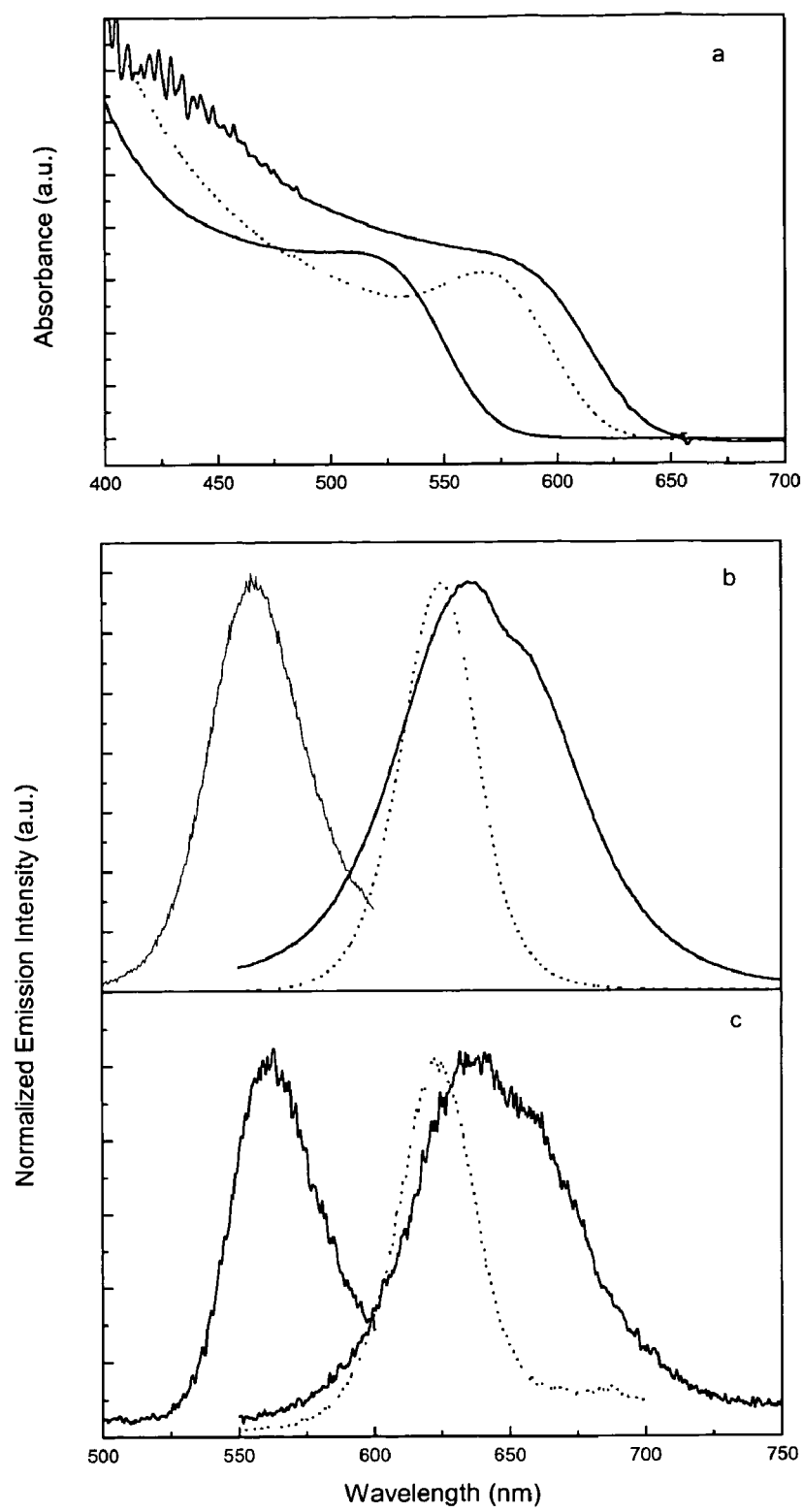
FIG. 15 is a graphical representation showing the emission spectra of BaFBr:$Eu^{3+}$ nanoparticles before (1) and after UV irradiation at 225 nm for 5 (2), 10 (3) and 15 min (4), then exposure to a 600 nm light for 5 min (5) and then to a visible lamp for 15 min, respectively.

Undoped nanoparticles also exhibit PSL. In undoped nanoparticles, PSL is caused by the stimulation of electrons or holes trapped at surface states, defects or in the matrices or ths stabilizers. CdTe nanoparticles were also prepared and the PSL studied. Strong photostimulated luminescence was observed in CdTe nanoparticles. FIG. 15 shows the absorption, photoluminescence (PL) and PSL spectra of 2.5 and 5 nm sized CdTe nanoparticles, respectively. The PL emission maximum wavelength is excitation wavelength dependent, shifting to longer wavelengths for shorter excitation wavelengths, while PSL emission position varies little for different excitation wavelengths. The PSL emission band is red-shifted if compared with the Stokes emission, and the shift is larger for smaller particles. The PSL emission bandwidth is narrower than that of the Stokes emission band. The PSL is quenched when the nanoparticles are oxidized or by surface modification, indicating that the PSL of CdTe nanoparticles is related to the surface states.

Described hereinafter is a reversible optical process as observed in $Eu^{3+}$ doped nanoparticles. Under UV irradiation, the luminescence of $Eu^{3+}$ decreases in intensity and by IR or visible stimulation the luminescence quenching can be recovered. A process involving the conversion of $Eu^{3+}$ to $Eu^{2+}$ under UV irradiation and an opposite change from $Eu^{2+}$ to $Eu^{3+}$ under visible or IR stimulation is given to explain this newly observed reversible process of $Eu^{3+}$ doped nanoparticles. The following experimental results show that $Eu^{3+}$ doped nanoparticles can be used as a new medium for reversible optical storage.

As mentioned previously, in recent years, a demand for improved data storage has accompanied the dramatic advances in computing and communication technology. The requirement for high capacity optical memory has led to much research in optical materials, medium structures, and system concepts. Using nanoparticles or quantum dots (QDs) as a storage medium offers tremendous potential. The shortcomings of prior known approaches using nanoparticles are that they are limited to short durations (several hundred microseconds to several seconds) and only function at low temperature.

As mentioned previously, the photosensitivity of CdSe nanoparticles, silver oxide nanoparticles, and Ag-doped phosphates leads to their use in storage systems. Hereinafter a new way of optical storage apparatus and methodology is given based on the reversible optical processes of doped nanoparticles, such as $Eu^{3+}$ doped nanoparticles, at room temperature.

$Eu^{3+}$-doped BaFBr nanoparticles were prepared according the following reaction in water solution.

$Ba(NO_3)_2 + NaBr + NaF \rightarrow BaFBr + 2NaNO_3$.

Poly(vinyl-alcohol) was used as a stabilizer. In a four-neck flask, poly(vinyl alcohol) (3 g) was mixed with 200 mL dionized water. Calculated amounts of $Ba(NO_3)_2$ and $Eu(NO_3)_3$ (molecular ratio of Eu/Ba=0.5/99.5) were filled into the flask and stirred under $N_2$ for 30 min. Then, calculated NaBr and NaF (molecular ratio of 1:1) were filled slowly into the solution through two necks. The reaction was carried out in a $N_2$ atmosphere at 80° C. for 3 hours. The nanoparticles were separated by centrifugation and dried in a vacuum at room temperature. The formation of BaFBr nanoparticles was demonstrated by X-ray diffraction. The average size of the particles was about 50 nm as estimated from the widths of the X-ray diffraction peaks.

$Eu^{3+}$ clusters were formed into the cavities of zeolite-Y by a well known method called ion exchange, which is expressly incorporated herein in its entirety). The ion-exchange was carried out in water at 80° C. Typically, 2 g zeolite-Y powder and 0.2 g $Eu(NO_3)_3.6H_2O$ filled into a flask with 400 mL $H_2O$. The exchange reaction was carried out while stirring in air for 2 hours. Then the $Eu^{3+}$-exchanged zeolite was collected by filtration, washed extensively with a water-acid (HCl) solution (pH=5), and dried in vacuum at 150° C. for 4 hours. The photoluminescence (PL) emission and excitation spectra of the nnaoparticles were recorded using a SPEX FLUOROLOG™ (obtainable from Jobin Yvon, Ltd. of the Uniited Kingdom) fluorescence spectrophotometer. Before exchange, fluorescence from the zeolite-Y powder was not observed. After exchange, strong red luminescence of $Eu^{3+}$ was observed from the samples. This indicates that $Eu^{3+}$ ions were encapsulated into the zeolite cavities by ion-exchange. The optical reversible process was investigated by ultraviolet (UV) irradiation and visible light stimulation at particular wavelengths from the xenon lamp of the fluorescence spectrometer. All measurements were carried out at room temperature.

It was found that the fluorescence of $Eu^{3+}$-doped nanoparticles is very sensitive to light. The emission of $Eu^{3+}$ can be quenched by UV irradiation. Emission is recoverable by visible light stimulation. This is a reversible optical process that can be potentially applied for optical storage.

Figure 16:
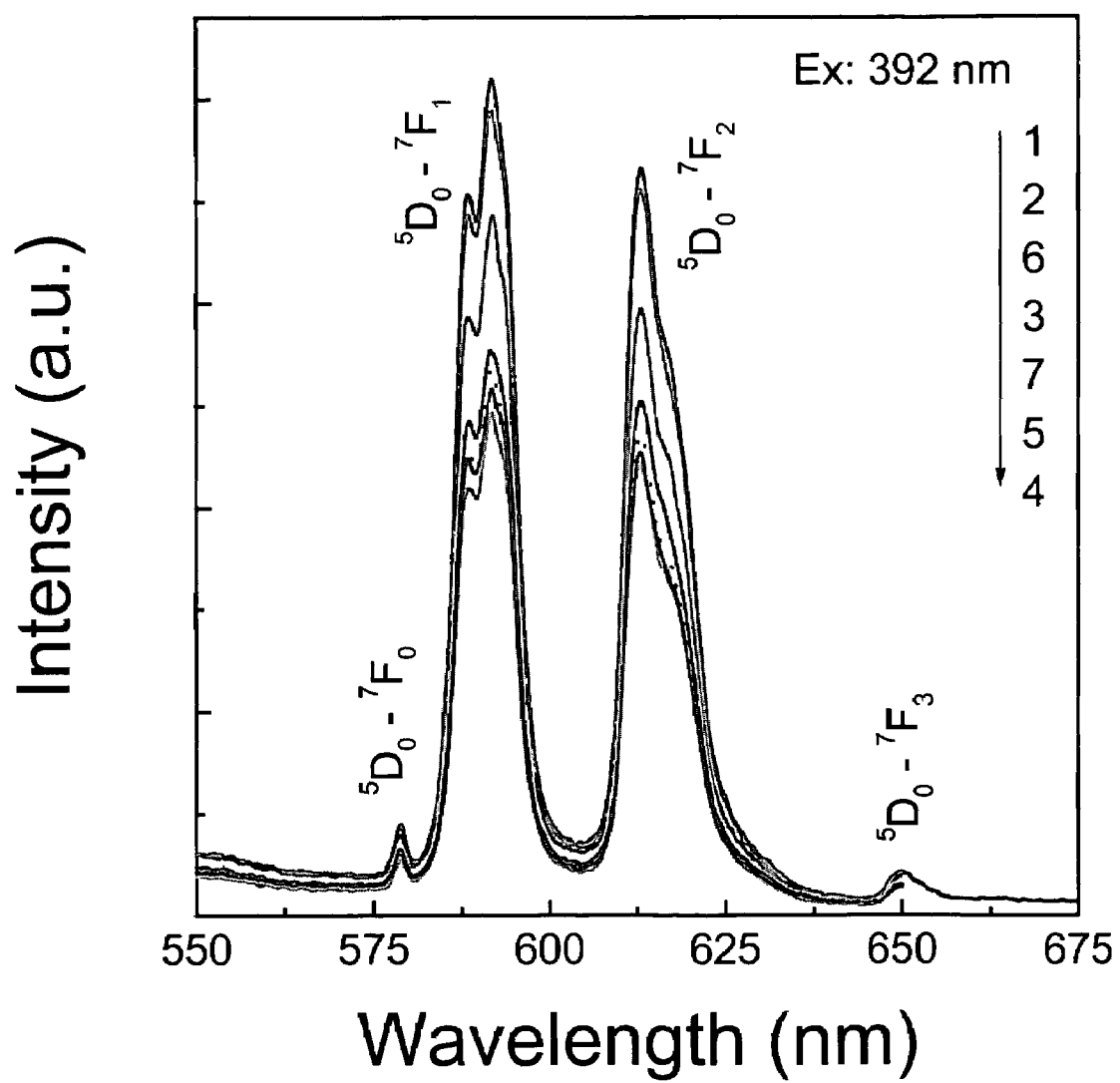
FIG. 16 is a graphical representation showing the emission spectra of $Eu^{3+}$-zeolite-Y before (1) and after (2) UV irradiation at 254 nm for 5 min, and then to a visible lamp for 10 min (4), respectively.

The emission spectra of BaFBr:$Eu^{3+}$ are displayed in FIG. 16. The four emission bands are from the transitions of $^5D_0 \rightarrow {}^7F_0$, $^5D_0 \rightarrow {}^7F_1$, $^5D_0 \rightarrow {}^7F_2$ and $^5D_0 \rightarrow {}^7F_3$, respectively. It is shown in FIG. 16 that under UV irradiation at 225 nm the $Eu^{3+}$ emission decreases in intensity. This luminescence quenching is recovered slightly by exposure to a red light at 600 nm, and it is recovered very quickly by exposure to a visible light (500 to 800 nm).

Figure 17:
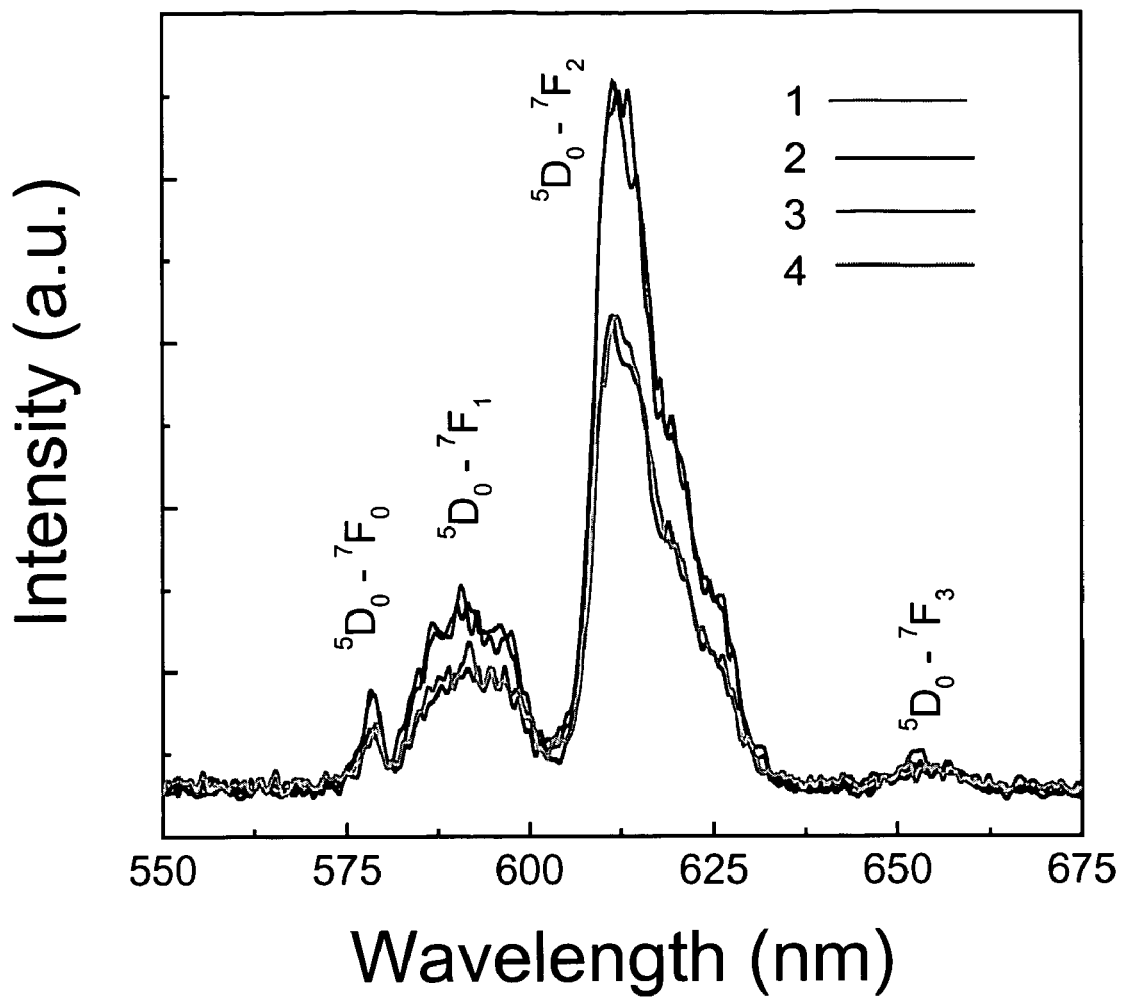
FIG. 17 is a graphical representation of how electrons and holes are produced in nanoparticles and, more specifically, in $Eu^{3+}$ doped nanoparticles.

Similar results were also observed in $Eu_2O_3$ nanoparticles encapsulated in zeolite-Y, $Eu^{3+}$ nanoclusters in zeolite and $Eu^{3+}$-doped $Y_2O_3$ nanoparticles. One example is shown in FIG. 17 for $Eu^{3+}$ clusters in zeolite-Y. Under UV irradiation at 254 nm, the emission of $Eu^{3+}$ decreases. Under stimulation at 840 nm, very little recovery is observed. However, under stimulation from a visible lamp (500 to 800 nm), the fluorescence after UV quenching is recovered almost 100%.

It is noted that the emission spectral patterns of $Eu^{3+}$ in BaFBr:$Eu^{3+}$ and $Eu^{3+}$:zeolite-Y are different. In BaFBr:$Eu^{3+}$, the $^5D_0 \rightarrow {}^7F_1$, emission band is more intense than the $^5D_0 \rightarrow {}^7F_2$ emission band while in $Eu^{3+}$-zeolite-Y, the $_5D_0 \rightarrow {}^7F_2$ band is much stronger than the $^5D_0 \rightarrow {}^7F_1$ emission. This is due to the surrounding environments of $Eu^{3+}$ in the two materials being different. The $^5D_0 \rightarrow {}^7F_1$ and $^5D_0 \rightarrow {}^7F_2$ transitions are the so called "hypersensitive luminescence", which is highly sensitive to structure change and environmental effects, and the intensity ratio of $^5D_0 \rightarrow {}^7F_1$ to $^5D_0 \rightarrow {}^7F_2$ provides significant information about the site symmetry and structure of the materials.

Figure 18:
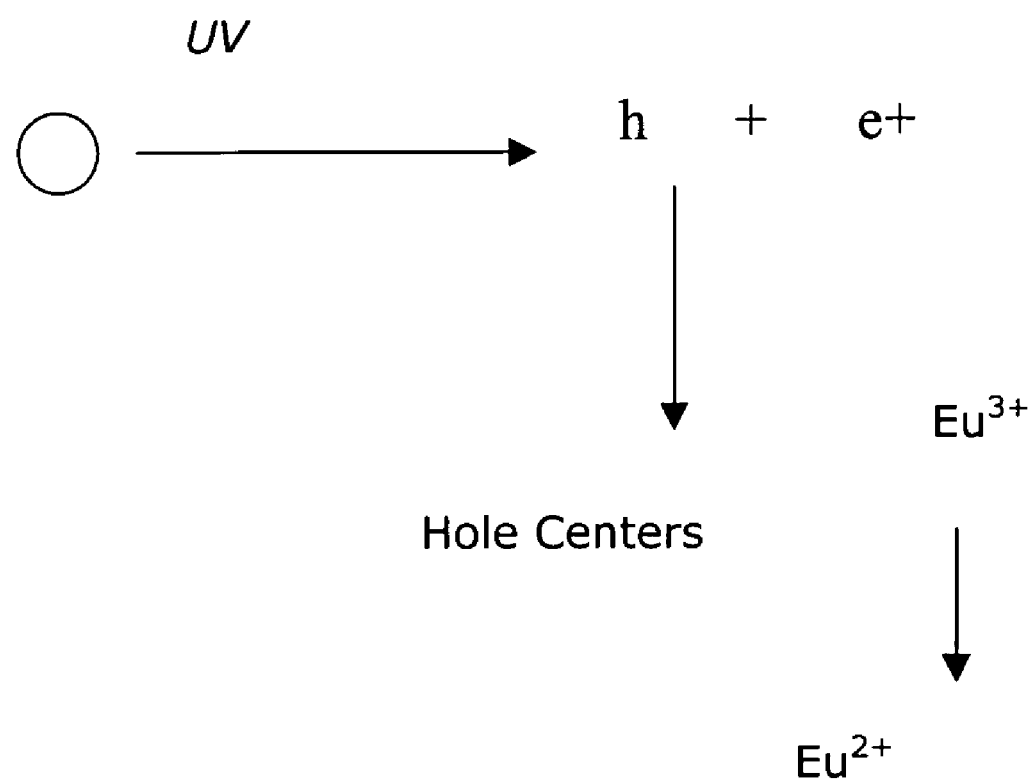
FIG. 18 is a graphical representation of the emission spectra of $Y_2O_3$:$Tb^{3+}$, $Eu^{3+}$ nanoparticles before and after x-ray irradiation for 10 minutes.

The physical mechanism for the optical reversible process is the reversible charge transfer between $Eu^{3+}$ and $Eu^{2+}$ ions. Charge transfer between $Eu^{3+}$ and $Eu^{2+}$ has been previously reported in several systems. It has also been reported that under high energy radiation, rare earth (RE) ions can be oxidized or reduced. This is determined by the oxidation or reduction potentials of the ions. Nugent et al. (1975) extensively investigated the oxidation states of RE ions. According to their investigations, the oxidation of $RE^{3+}$ to $RE^{4+}$ ions is possible if the optical electronegativity ($\chi(RE^{4+})$) is less than or equal to 3.03, and the standard reduction potential ($E_{RE}^0(RE^{4+} \rightarrow RE^{3+})$) is less than or equal to 5.2 V. For example, the $\chi(Tb^{4+})$ is 2.55 and the $E_{RE}^0(Tb^{4+} \rightarrow Tb^{3+})$ is 3.30 V, favoring the appearance of $Tb^{4+}$ ions. For $Eu^{3+}$ ions, it is impossible for $Eu^{4+}$ compounds to appear and it is difficult for the oxidation of $Eu^{3+}$ to $Eu^{4+}$, because the $X(Eu^{4+})$ (3.40) is larger than 3.03 and the $E_{RE}^0(Eu^{4+} \rightarrow Eu^{3+})$ (6.4 V) is larger than 5.2 V. This indicates the reduction of $Eu^{3+}$ to $Eu^{2+}$ is more favorable. In addition, $Eu^{2+}$ is a half-filled configuration of $4f^7$. In energy, $Eu^{2+}$ is more stable than $Eu^{3+}$. This is another reason for the reduction of $Eu^{3+}$ to $Eu^{2+}$ under high energy radiation. Thus, under UV irradiation at 254 nm, electrons and holes are produced in the nanoparticles, and $Eu^{3+}$ ions are reduced to $Eu^{2+}$ ions as shown in FIG. 18.

The UV generated holes are trapped in the surface states of the nanoparticles or in the defects of the host materials like zeolites to form hole centers. Under visible or IR stimulation, these holes are released from their traps and recombined with $Eu^{2+}$ to form $Eu^{3+}$ according to the following formula:

$$Eu^{2+} + h \rightarrow Eu^{3+}.$$

Thus, the luminescence of $Eu^{3+}$ can be recovered under visible or IR stimulation. This process is similar to but also different from the PSL of $Eu^{2+}$ in $BaFBr:Eu^{2+}$ phosphors and to hole-burning process in BaFCl:Sm. The similarity is that all the processes involve charge transfer between $Eu^{2+}$ and $Eu^{3+}$ (or between $Sm^{2+}$ and $Sm^{3+}$). The difference is in both the PSL and hole-burning processes, it is electron centers (F centers) involved, while in the process described herein, the hole centers are involved in the luminescence process. Such a reversible optical material is highly desirable and particularly useful in optical imaging systems, sensors, and medical imaging syatems, as described hereinafter in more detail.

As described hereinabove, when $Tb^{3+}$ and $Eu^{3+}$ are doped into the same host, the following reaction occurs:

$$Tb^{3+} + Eu^{3+} \leftrightarrows Tb^{4+} + Eu^{2+}.$$

Figure 19:
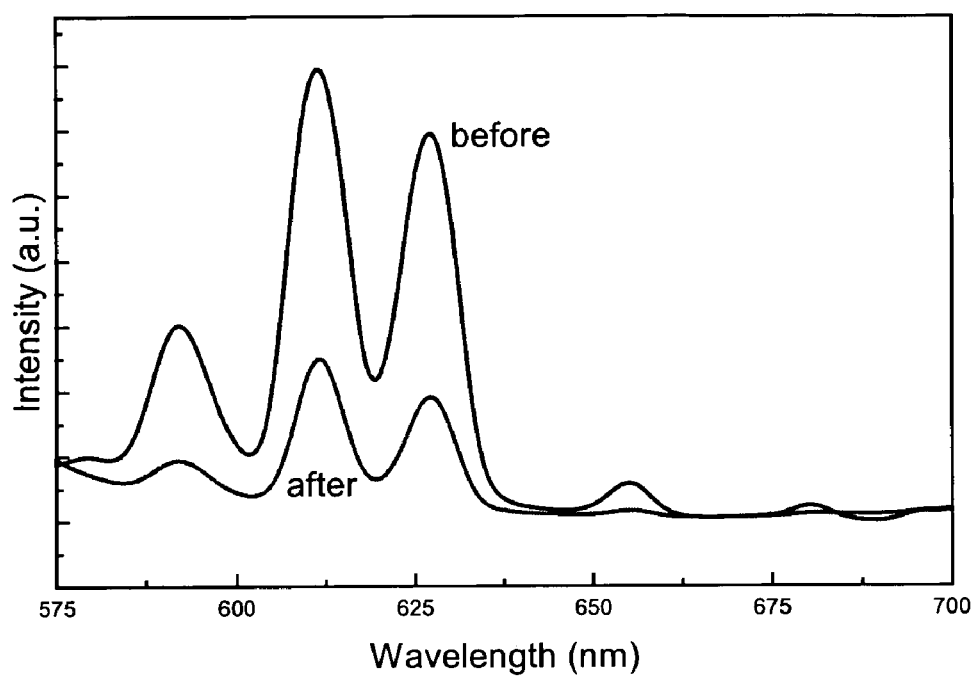
FIG. 19 is a graphical representation of the absorption(a), fluorescence(b) and PSL(c) of CdTe nanoparticles.

The above reaction occurs in $Y_2O_3:Tb^{3+},Eu^{3+}$ nanoparticles which can be used for reversible optical storage. The emission spectra of $Y_2O_3:Tb^{3+},Eu^{3+}$ nanoparticles is shown in FIG. 19. Only the emissions of $Eu^{3+}$ are observed from $Y_2O_3:Tb^{3+},Eu^{3+}$ nanoparticles, emision of $Tb^{3+}$ is not observed. This is due to the efficient energy transfer from $Tb^{3+}$ to $Eu^{3+}$ as discussed in the art. After X-ray irradiation for 10 min, the luminescence of $Y_2O_3:Tb^{3+},Eu^{3+}$ nanoparticles is decreased largely as shown in FIG. 19, and an obvious 'band' was observed on the sample The change in color and the florescence quenching is related to the above referenced reaction. The changes in color or fluorescence of this nanoparticle cannot, however, be recovered by exposure to visible light or infrared light, and PSL signal is not observed from $Y_2O_3:Tb^{3+},Eu^{3+}$ nanoparticles. This indicates that the above reaction induced by X-ray radiation is not reversible. However, the photosensitivity of $Y_2O_3:Tb^{3+},Eu^{3+}$ nanoparticles to X-ray irradiation does provide for other applications, such as X-ray lithography.

An additional example of nanoparticles useful for optical storage systems is $ZnS:Mn^{2+}, Eu^{3+}$ co-doped nanoparticles. $ZnS:Mn^{2+}, Eu^{3+}$ nanoparticles were prepared as following: A four-neck flask was filled with a solution containing methacrylic acid, citric acid, 500 mL deionized water, and 500 mL of ethanol. The solution was stirred under $N_2$ for 2.5 hours. A second aqueous solution containing 8.009 g $Na_2S$ and 200 mL of ethanol, and a third aqueous solution containing 3.337 g $Zn(NO_3)_2 \cdot 6(H_2O)$, 0.114 g of $Eu(NO_3)_3$, 0.2 g of $Mn(NO_3)_2$ and 200 mL of ethanol ($Eu^{3+}/Mn^{2+}/Zn^{2+}$ molar ratio 2:3:95) were prepared and added to the first solution simultaneously via two different necks. After the addition, the resulting solution was stirred constantly under $N_2$ at 80° C. for 2.5 h and a transparent colloid of $ZnS:Mn^{2+},Eu^{3+}$ was formed. The pH value of the final solution was 2.4. This relatively low pH value is required to prevent the precipitation of unwanted Mn and Eu species. The nanoparticles were separated from solution by centrifugation and dried in a vacuum at room temperature.

Figure 20:
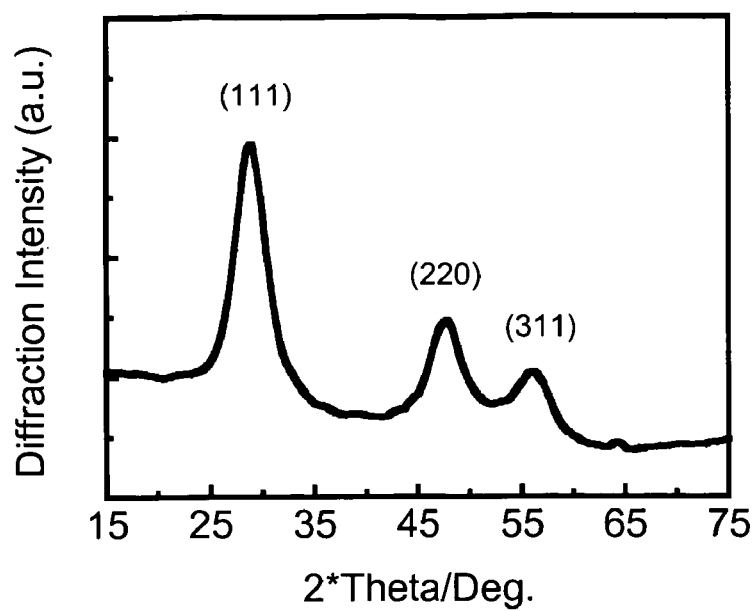
FIG. 20 is an X-ray diffraction pattern of ZnS:$Mn^{2+}$,$Eu^{3+}$ nanoparticles.
Figure 21:
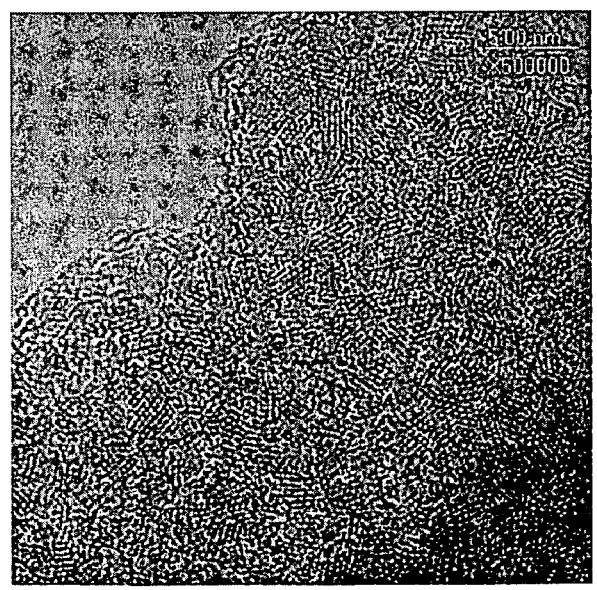
FIG. 21 is an HRTEM image of ZnS:$Mn^{2+}$,$Eu^{3+}$ nanoparticles.

The X-ray Deflection (XRD) measurement demonstrates that the particles have the zinc blend structure (sphalerite) (FIG. 20). Broad XRD lines are indicative of small size of ZnS nanoparticles. From the Debye-Scherrer equation the average sizes of the nanoparticles are estimated from half-width of these lines to be ~3 nm. FIG. 21 shows the high resolution transmission microscope (HRTEM) images of the particles prepared in dispersions. The average size is around 3 nm, which agrees with the XRD measurements. The (111) lattice planes of some particles can be observed in the HRTEM images. The (111) lattice spacing of the particles was estimated to be around 0.31 nm from the HRTEM images. This is consistent with the (111) spacing of bulk ZnS (0.312 nm). EDX gives reasonable Zn and S data. About 55–60 atom % Zn and about 40 atom % S. We find 1–2 atom % Eu in all analyses, however, Mn is below the detection limit (less than 0.2%). These results indicate that sulfur is deficient in the nanoparticles.

Figure 22:
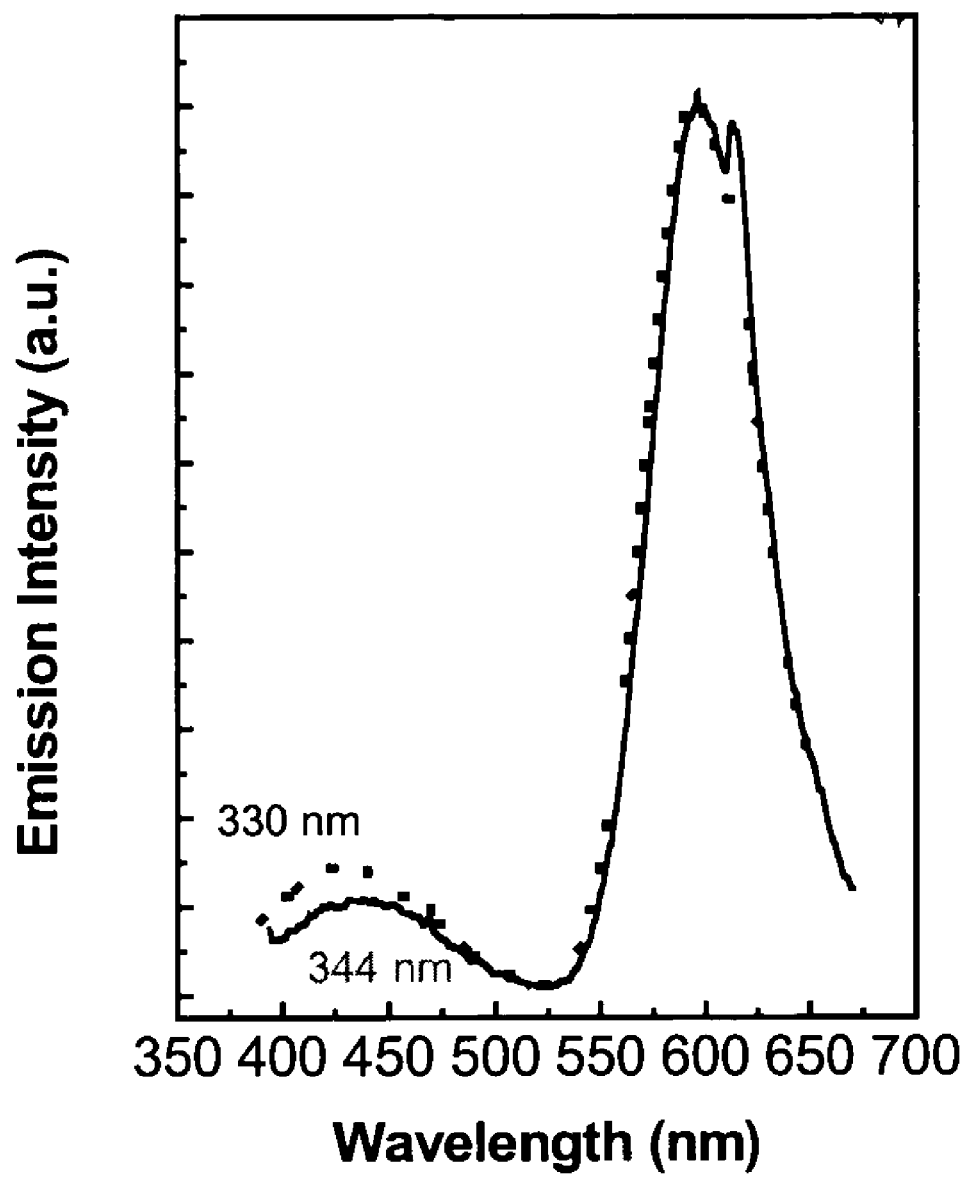
FIG. 22 is an emission spectra of ZnS:$Mn^{2+}$,$Eu^{3+}$ nanoparticles.

FIG. 22 displays the emission spectra of $ZnS:Mn^{+2},Eu^{+2}$ nanoparticles excited at 330 and 344 nm, respectively. The emission peaking at 430 nm is due to the donor-acceptor (DA) pairs which is related to sulfur related defects. The emission at 600 nm is attributed to the $^4T_1$ to $^6A_1$ transition of $Mn^{2+}$ ions, while the sharp emission line at 615 nm is due to the f-f transition of $Eu^{3+}$. It is noted that the $Eu^{3+}$ emission is observed by excitation at 344 nm but it is not apparent under excitation at 330 nm.

Figure 23:
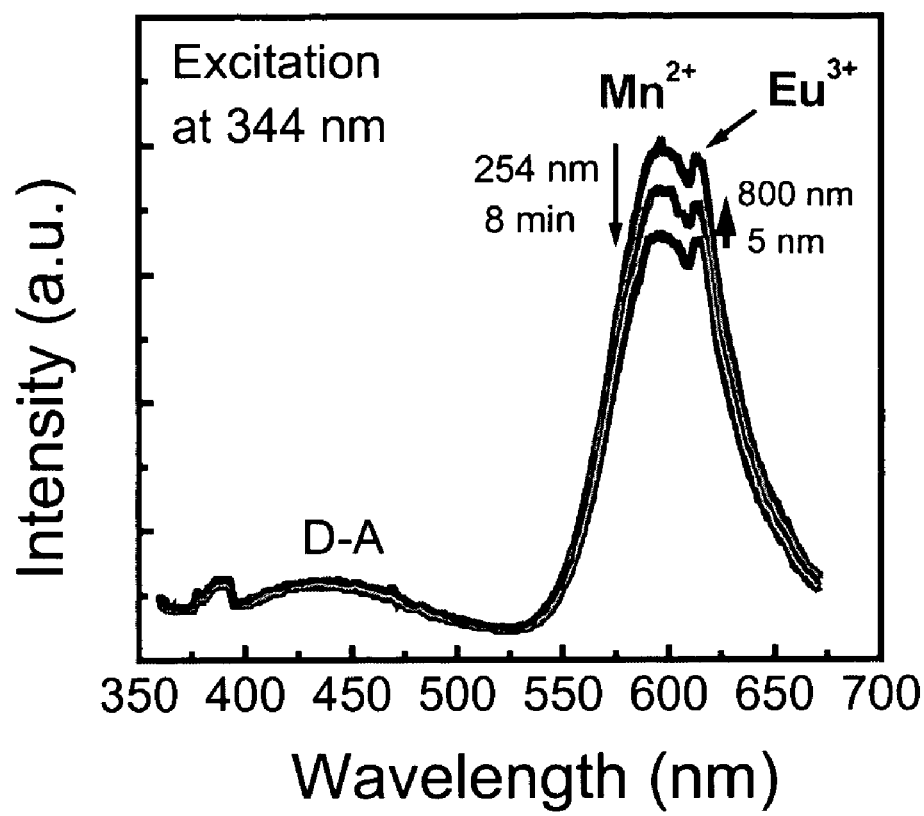
FIG. 23. graphically depicts the photosensitivity of ZnS:$Mn^{2+}$,$Eu^{3+}$ nanoparticles.
Figure 24:
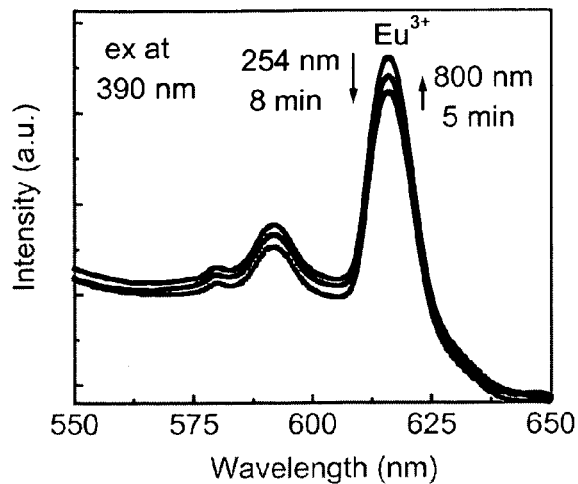
FIG. 24 graphically depicts the photosensitivity of ZnS:$Mn^{2+}$,$Eu^{3+}$ nanoparticles.
Figure 25:
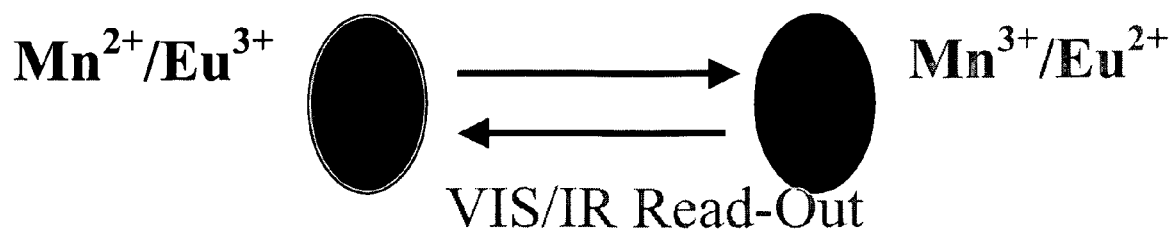
FIG. 25 is a schematic illustration ZnS:$Mn^{2+}$,$Eu^{3+}$ nanoparticles for optical storage.

The $ZnS:Mn^{2+}, Eu^{3+}$ codoped nanoparticle is sensitive to light. Under UV irradiation at 254 nm, both the emissions of $Mn^{2+}$ and $Eu^{3+}$ decrease in intensity. On the contrary, under stimulation at 800 nm, both emissions of $Mn^{2+}$ and $Eu^{3+}$ can recover in intensity (FIGS. 23 and 24). This reversible optical process is controllable by light and is useful for optical storage methods. Based on our electron spin resonance measurements, the mechanism for the reversible process is due to charge transfer between $Mn^{2+}$ and $Eu^{3+}$. Charge can transfer back and forth from $Mn^{2+}$ to $Eu^{3+}$ as shown in FIG. 25.

The following examples of nanoparticles disclosed and claimed herein may be summarized into four classes: (1) undoped semiconductor nanoparticles (CdTe, CdSe, ZnO, CdS, ZnS), (2) doped semiconductor nanoparticles (CdS: $Mn^{2+}$, $ZnS:Mn^{2+}$, $ZnS:Mn^{2+}$, $Eu^{3+}$, $ZnS:Cu^+$, etc), (3) rare earth ($Eu^{3+}$ or $Eu^{2+}$)-doped nanoparticles ($Y_2O_3:Eu^{3+}$, ZnS: $Eu^{3+}$, Zeolite:$Eu^{3+}$, $MgS:Eu^{3+}$, $BaFBr:Eu^{3+}$, $BaFBr:Eu^{2+}$ etc) and (4) Silver, silver halide nanoparticles.

The recipes for making Group II–VI semiconductor nanoparticles disclosed and claimed herein are similar to these reported in literature. One examplary recipe or methodology for making CdTe nanoparticles is hereafter given as follows. The CdTe nanoparticles were prepared by a wet chemical technique which has been reported in literature. Cadmium perchlorate hydrate (Aldrich), aluminum telluride (99.5% pure, Gerac), and thioglycolic (mercaptoacetic) acid (Aldrich) were used as received. CdTe nanoparticles were prepared by the rapid mixing of precursors containing cadmium perchlorate hydrate and sodium hydrotelluride (NaHTe), cooled to 5° C., under vigorous stirring. The $Cd^{2+}$ containing solution was prepared as follows: 0.73 g of $Cd(ClO_4)_2 \cdot H_2O$ was dissolved in 125 mL of water. 0.3 mL of thioglycolic acid (TGA) was added to the solution and its pH was adjusted to ~11.2 by the addition of 0.1M NaOH. The solution was then purged with nitrogen for at least 30 minutes. The solution of NaHTe was prepared in a vessel cooled with ice water to 5° C., by bubbling an excess of $H_2Te$ through 22 mL of 0.05M NaOH for 40 minutes under nitrogen. The hydrogen telluride gas was obtained from the reaction of excessive amounts of $Al_2Te_3$ and 0.5M $H_2SO_4$ in an inert atmosphere (nitrogen). Great care was taken to keep the NaHTe solution temperature at an average of 5° C., as well as to avoid any contact of the solutions involved with oxygen (air) at all times.

After the completion of the reaction, a yellow solution of CdTe nanocrystal nuclei was obtained. This solution was then refluxed at 100° C. to promote crystal growth. The size of the particles was controlled by the reaction time. The size of the nanoparticles used in this invention is around 4 nm as observed by HRTEM. Most nanoparticle are spherical in shape, while some of them are nonspherical. The (111) lattice strings can be seen from the HRTEM images, and the spacing found is about 0.36 nm, which is in agreement with the (111) spacing of cubic CdTe of 0.374 nm.

Formation of CdS/BaTiO$_3$ nanostructured materials: Ba—Ti complex alkoxide solution and CdS colloidal solution were prepared separately, and mixed together to form the composite precuser solution. To make Ba—Ti complex alkoxide solution, barium ethanoxide solution, prepared by dissolving metal barium into ethanol, and titanium isopropanide solution in 2-methoxidethanol were mixed and stirred for a few hours. CdS colloidal solution was prepared by a selinazation process of Cd(NO$_3$)$_2$ and H$_2$S flux in 2-methoethnaol with existence of N,N-dimethlyformamide. The particle size can be controlled by the concentration of Cd(NO$_3$)$_2$ and N,N-dimethlyformamide. The colloid solution as prepared was added to the alkoxide solution with molar ratio of Cd/Ba=0.02, then a clear composite precursor solution was obtained. Thin films may be prepared by spin coating with the fresh precursor solution, and then dried at 100° C. in air, heat treated at 200–800° C. in N$_2$ atmosphere.

The recipe for making uncapped ZnS:Mn nanoparticles is as follows: A four-neck flask was filled with 400 mL deionized water and was stirred under N$_2$ for 2.5 hrs. An aqueous solution of 1.6 g Na$_2$S and an aqueous solution of 5.8 g Zn(NO$_3$)$_2$.6(H$_2$O) and 0.26 g Mn(NO$_3$)$_2$ (Mn$^{2+}$/Zn$^{2+}$ molar ratio 5:95) were prepared and added to the first solution simultaneously via two different necks at the same rate. After the addition, the resulting solution was stirred constantly under N$_2$ at 80° C. for 24 hrs and a transparent colloid of ZnS:Mn was formed. The pH value of the final solution was 2.4. This relatively low pH value is required to prevent the precipitation of unwanted Mn species. The nanoparticles were separated from solution by centrifugation and dried in vacuum at room temperature. The particle size is around 10 nm as determined by high-resolution transmission electron microscope.

The ZnS:Eu$^{2+}$ nanoparticles were prepared in a water-ethanol solution as follows: In a four-neck flask, the water-ethanol solution (500 mL water and 500 mL 99.95% ethanol) was stirred while purging with N$_2$ for 2.5 hrs, then a Na$_2$S solution was added (8.009 g Na$_2$S dissolved in 100 mL 99.95% ethanol and 100 mL deionized water) and a mixed solution of Zn$^{2+}$ and Eu$^{2+}$ (30.337 g Zn(NO$_3$)$_2$.6(H$_2$O) and 0.114 g EuCl$_2$ dissolved in a mixture of 150 mL 99.95% ethanol and 50 mL deionized water) were added at the same time with the same speed through two necks, respectively. The reaction was carried out in a N$_2$ atmosphere at 80° C. for 2.5 hours. Then a transparent colloid of ZnS:Eu$^{2+}$ was then obtained. The nanoparticles were separated by centrifugation and dried in a vacuum at room temperature. The pH value of the final solution is 2.4, which prevents precipitation of other Eu species outside the particles in the same manner as reported for Mn$^{2+}$-doped ZnS nanoparticles.

The recipe for making ZnS:Eu$^{3+}$ nanoparticles is similar to that for ZnS:Eu$^{2+}$ nanoparticles. Just two different points are: it is Eu(NO)$_3$ rather than EuCl$_2$ that provides Eu$^{3+}$; the reaction is conducted in an air not in a N$_2$ atmosphere.

The recipe for making ZnS:Ag$^+$ nanoparticles is as follows. A four-neck flask is filled with a solution containing 10 mL methacrylic acid and 400 mL ethanol (99.95%). The solution is stirred under N$_2$ for 2.5 hours. A second solution containing 1.6 g of Na$_2$S and 100 mL of ethanol and a third solution containing 5.8 g of Zn(NO$_3$)$_2$.6(H$_2$O), 0.22 g of AgNO$_3$, and 100 mL of ethanol (Ag$^+$/Zn$^{2+}$ molar ratio 5:95) are prepared and added to the first solution simultaneously via two different necks at the same rate. After this addition, the resulting solution is stirred constantly under N$_2$ at 80° C. for 2.5 hours so that a transparent colloid of ZnS:Ag$^+$ is formed. The pH value of the final solution is 3.0. This relatively low pH value is required to prevent the precipitation of unwanted Ag species from occurring.

The recipe for making Y$_2$O$_3$:Tb$^{3+}$, Eu$^{3+}$ nanoparticles is as follows. Solution (A) was prepared by dissolving 15.78 g of Y(NO$_3$)$_3$.5H$_2$O, 0.250 g of Eu(NO$_3$)$_3$ and 0.350 g of Tb(NO$_3$)$_3$ in ethanol. The solution was stirred for 2 h at room temperature. Solution (B) was prepared by dissolving 0.25 mL of tween-80poly-oxyethylene(20)sorbitate and 0.25 mL of emulson_OG (oelsauerepolyglyscerinester) in 50 mL of aqueous ammonium hydroxode solution (pH >10) and stirred for 1 h at room temperature. Solution (A) was then added to solution (B) drop by drop through a burette at a controlled rate (10 drops per minute) with vigorous stirring. The obtained gel was separated in a centrifuge. The aqueous solution was removed by refluxing in toluene using a water trap. The toluene was removed by evaporation, and the resulting powder was dried in the oven at 60° C. for 2.5 h. The final products may be isolated as white powders of different sizes after heat treatment in a box furnace at different temperatures for 3 h in ambient atmosphere.

The preparation of BaFBr:Eu$^{2+}$ nanoparticles is based on the following reaction in acid solutions:

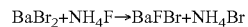

$$BaBr_2 + NH_4F \rightarrow BaFBr + NH_4Br$$

To control the reaction rate, we added stabilizers (poly (vinyl alcohol)) to the solution and controlled the reaction temperature. In our experience, we found the following recipe can successfully make BaFBr:Eu nanoparticles:

A four-neck flask was filled with 400 mL deionized water and 4 g poly(vinyl alcohol) and was stirred under N$_2$ for 1 hr. The pH value was adjusted to 2 by nitric acid.

4.83 g BaBr$_2$.2H$_2$O and 0.137 g EuI$_2$ were added to the solution and stirred under N$_2$ for 1 hr at room temperature.

0.70 g NaF was added to the solution and stirred under N$_2$ for 0.5 hr at room temperature until precipitation occurred.

The temperature was raised to 80° C., the reaction was sustained for 2 hrs. and then, cooled rapidly to room temperature.

The nanoparticles were separated from solution by centrifugation, washed with deionized water, and dried under a vacuum at room temperature.

The powder was heated at a temperature lower than 450° C. in a carbon monoxide or N$_2$ atmosphere for 0.5 hr.

For making BaFBr:Eu$^{2+}$ nanoparticles in MCM-41, bulk BaFBr:Eu$^{2+}$ powder was made by solid state diffusion at 800° C. for 2 hours. Then, BaFBr:Eu$^{2+}$ powder and MCM-41 powder (ratio of BaFBr:Eu$^{2+}$/MCM-41 is 5:95) were mixed up and heated at 600° C. under N$_2$ for 2 hours. The recipe for BaFBr:Eu$^{3+}$ is the same but reaction was conducted in an air rather than in a N$_2$ atmosphere.

Figure 26:
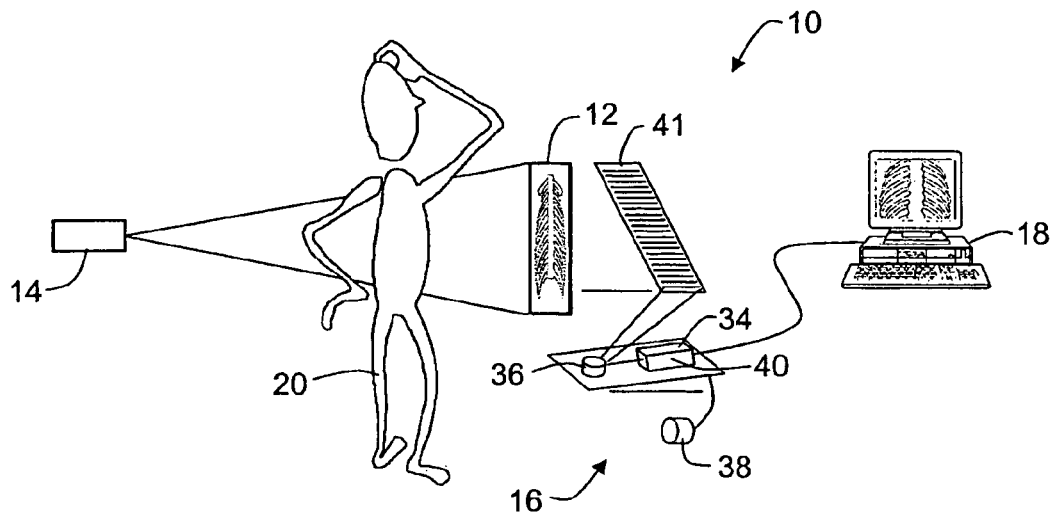
FIG. 26 is a a schematic illustration of a digital imaging system for optical digital imaging and diagnostics.

Referring now to FIG. 26, shown therein is a digital imaging system 10 constructed in accordance with the present invention. In general, the digital imaging system 10 converts energy patterns, such as X-ray energy patterns into digital signals. The digital imaging system 10 can be used for medical imaging and diagnosis, as well as radiation detection.

The digital imaging system 10 is provided with an image plate 12, a light source 14, an image reader 16, and an image processor 18. The light source 14 emits light generally in the direction of the image plate 12. The light emitted by the light source 14 is typically of a constant or known energy level. The light passes through a portion of a subject 20, such as an individual, and is received by the image plate 12. As is well known in the art, as the light passes through the subject 20 part of the light is absorbed. Thus, the light exiting the subject has an energy pattern based on the characteristics of the subject 20.

Figure 27:
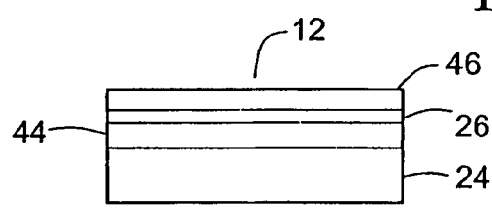
FIG. 27 is a side-elevational view of a nanoparticle thin film imaging plate.

Referring now to FIG. 27, in general, the image plate 12 includes a matrix 24 and a nanoparticle array 26 operatively associated with the matrix 24. The nanoparticle array 26 is formed of photostimulated luminescence (PSL) nanoparticles which cooperate to store energy indicative of the energy patterns when the photostimulated luminescence nanoparticles are exposed to such energy patterns.

Referring once again to FIG. 26, in general, photostimulated luminescence involves storing part of the absorbed energy patterns as trapped electrons and holes in the nanoparticles of the image plate 12. The stored energy is released by the image reader 16. For example, the image reader 16 can include a laser 34, such as a focused He—Ne laser, which empties the traps by optical stimulation to give luminescence due to electron-hole recombination. The laser can be scanned by a spinning horizontal line scanning mirror 36, in combination with a vertical tilt table 38. The photostimulated luminescence intensity, is measured for each area on the imaging plate 12, using a photodetector 40, such as a photomultiplier tube or a charge coupled device (CCD), and converted into data to be stored in the image processor 18. A fixed mirror 41 can be provided to keep the remainder of the image reader 16 out of the light path.

The image plate 12 can be placed in a cassette or holder, for example, and used with conventional X-ray machines, and the digital imaging radiographs can be shared among medical personnel over the Internet or on digital storage media. In addition, large area image plates 12 can be conveniently produced, are reusable, have linear response over a wide range of X-ray or other energy level dosages, and can be erased simply by exposure to a uniform stimulating light or by thermal clearance. Further, the image plate 12 makes it possible to quantify the position and intensity of the radiation image. As background, the major considerations for PSL imaging phosphors are listed in Table 1. The energy structure in the nanoparticles is important to the effective operation of the detector. First, the emission spectrum should match the peak sensitivity of commercially available image readers 16. For example, the trap depth to the conduction band should be small enough so that stimulation with commercially available red laser light is possible, yet sufficiently large to prevent random thermal release of the electron from the trap. Also, the stimulating laser light by itself should not induce PSL centers, which would result in the nanoparticles exhibiting high background noise during readout. The nanoparticles must have a high storage capacity for electrons and holes for good post-irradiation stability at room temperature. Generally, the trap depth should be larger than 0.5 eV to prevent thermal release or fading at room temperature. The oscillator strength of the absorption of the trap that is stimulated as well as the recombination probability must be high in order to reduce the laser power needed to release the stored energy. High luminescence efficiency is necessary to minimize the required light, such as X-ray exposures. The decay time of the nanoparticles must be short and the shorter the better. A long decay time leads to long readout times. Dose linearity and reusability following readout or erasure are also important. In addition, the wavelength separation between the stimulation light for reading (corresponding to the color center absorption band) and the monitored emission light of the recombination center should be sufficiently large to avoid noise signals due to probing light reflection. Ideally, the nanoparticles should have only one type of trap to prevent signal loss due to electron migration among different traps.

As posited out that the photostimulable phosphor used in commercial X-ray imaging systems is $BaFBr:Eu^{2+}$, which meets most of the considerations reasonably well. The wavelength of $BaFBr:Eu^{2+}$ PSL (~390 nm) is separated from that of the stimulating light (632.8 nm), allowing it to be collected by a conventional high quantum efficiency photomultiplier tube (PMT). Compared to other integrating detectors, such as film and X-ray television cameras, the dynamic range of the imaging plate system is much wider. The response of the PSL is linear in the range from eight X-ray photons per pixel to $4\times10$ photons per pixel ($1:5\times10$), with an error rate of less than five percent. Finally, the accumulated background can be erased before use.

However, bulk $BaFBr:Eu^{2+}$ phosphors suffer from poor resolution due to the long decay lifetime of $Eu^{2+}$ emission (0.8 µs) and excessive scattering of the stimulating laser light. Because the traps are located throughout the depth of the phosphor material, the laser beam providing the stimulating light must penetrate into the phosphor. Scattering of the light within the phosphor causes the release of traps over a greater area of the image than the size of the incident laser beam. This results in a loss of spatial resolution, which is aggravated if the conventional image plate is made thicker to increase the efficiency, making the technique less suitable for fields such as mammography where high resolution is necessary. The hygroscopic nature of the conventional $BaFBr:Eu^{2+}$ phosphor limits the stability of the system. Further, at very low dosages, such as for X-ray irradiation less than 1 minute, approximating a PSL dose linearity is not a good approximation. Also, electron migration among different color centers reduces the sensitivity and reusability. The same is true for the application of PSL imaging plates for radiation detection.

Significantly, most of the prior art shortcomings can be overcome by quantum size confinement. For example, light scattering and absorption are both reduced in nano-sized phosphors due to the decreased surface areas.

Conventional $BaFBr:Eu^{2+}$ imaging plates suffer from low resolution due to the scattering of both the reading laser light and the emission light. This scattering is due to the phosphor grain size, shape, and boundary as well as surface roughness. Rayleigh's approximation for the interaction of light with matter tells us that for isotropic and separated particles:

Intensity of Scattered Light≈(Particle Diameter)$^6$.

This means that a 50 nm particle will scatter one million times more light than a 5 nm particle. Therefore, compared to traditional micrometer-sized phosphors, the light scattering from nanoparticles used in the formation of the image plate 12 (FIG. 27) is essentially zero. For purposes of explanation, nanoparticles are defined as particles having a particle size from about less than 100 nm.

In addition to the particle size, the grain shape of the phosphors is also an important factor determining the imaging resolution and uniformity. The low resolution with high light scattering of $BaFBr:Eu^{2+}$ system is in one way related to this shape. The grains of $BaFBr:Eu^{2+}$ are plate-shaped, which is determined by to the tetragonal space group P4/nmm. In order to have the nanoparticles in a spherical shape, we need to slow the growth rate in the z-direction and speed growth in the x- and y-directions. Recently, Peng et al. developed a new method for controlling particle shapes. The method set forth in Peng et al. (Peng, Z. A. et al., "*Formulation of High-Quality CdTe, CdSe, and CdS Nanocrystals using CdO as Precursor*", J. Of the American Chemical Society, vol. 123, iss. 1, pp. 183–184 (10 Jan. 2001) can be used to control the shape of the nanoparticles. The method set forth in Peng et al. is hereby incorporated herein by reference. Once the particle size, size-distribution, and shape are controlled, the grain boundary and the thin film surface are also controlled.

Referring, once again, to FIG. 27, the nanoparticles can be applied to the matrix 24 by any suitable method. For example, the nanoparticles can be applied as a thin film to an exterior surface 44 of the matrix, or can be doped or otherwise inserted into the matrix 24. The following methods are examples of suitable ways for applying the nanoparticles to the matrix 24: Layer-by-layer assembly: Spin-coating or spin-casting; Spray; Thermal spray; Droping; Supercritical Fluids; Thermal plasma deposition and Laser ablation.

The matrix 24 can be any material capable of receiving the nanoparticles without adversely effecting the photoluminescent properties of the nanoparticles. For example, the matrix 24 can be glass, polystyrene, polymer film or a non-luminescent material. The matrix 24 can be provided with any suitable 2-dimensional or 3-dimensional shape, such as flat, concave, convex, rectangular, circular, spherical and combinations thereof. For example, the matrix 24 can be provided with a flat rectangular shape. The matrix 24 can be a flexible or a non-flexible material.

Layer-by-layer (LBL) assembly is the preferred method of applying the nanoparticles to the matrix 24. For example, the advantages of layer-by-layer thin films are:
  Pinhole-free coatings, which may vary in thickness from nanometers to millimeters.
  Optimization of charge-transfer properties of the light-emitting layer via organized multilayer assemblies.
  Ordered multicomponent structures, which can be deposited on traditional solid flat substrates, flexible plastic skins, and curved sophisticated surfaces such as helmet visors with equal efficiency.
  Universality of the deposition-that is, different kinds of nanoparticles and conductive polyelectrolytes can be used with minimal variations in the deposition technique.

The driving force for LBL is the electrostatic attraction of positive and negative charges located on the surface of inorganic colloids and polyelectrolytes. An important thermodynamic contribution to the film stability is also made by the van Der Waals interactions. Typically, the assembly process consists of a cyclic repetition of four steps:
  1. immersion of the matrix into an aqueous 0.1–2% (w/v) solution of a polymer for 1–2 minutes,
  2. rinsing with ultra-pure water for 30 seconds,
  3. immersion into an aqueous dispersion of oppositely charged nanoparticles of PSL material, and
  4. final rinsing with deionized water for 30 seconds.

Referring, yet again, to FIG. 27, a protective covering 46 can be applied over the nanoparticles array 26 so as to protect the nanoparticles from abrasion, scratching or other damage. The covering 46 is constructed to permit energy to pass through the covering 46. For example, the covering 46 can be formed of a plastic film, UV curable film or epoxy.

Figure 28:
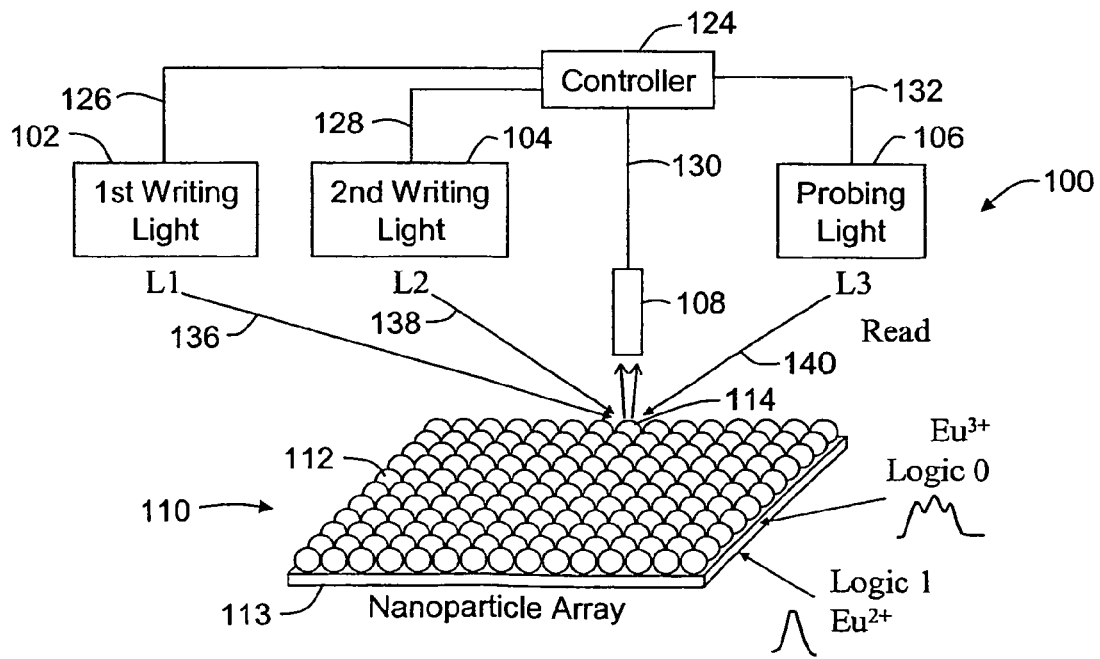
FIG. 28 is a schematic illustration of a storage device constructed in accordance with the present invention.

Referring now to FIG. 28, shown therein and designated by a reference numeral 100 is a schematic illustration of a storage device constructed in accordance with the present invention. The storage device 100 is provided with a first writing light 102, a second writing light 104, a probing light 106, a photodetector 108, and an image plate 110 which is preferably characterized as an optical disk. The image plate 110 is similar to the image plate 12, discussed above, except as discussed herein. The image plate 110 includes a particle array 112 associated with a matrix 113. The matrix 113 is similar to the matrix 24. The particle array 112 is applied to the matrix 113 in a similar manner as the nanoparticle array 26 is applied to the matrix 24. The particle array 112 includes a large number of particles or nanoparticles (only one of the particles or nanoparticles being indicated by reference numeral 114 for purposes of clarity). Each of the particles 114 or groups of the particles 114 in the particle array 112 are capable of forming a separate and independent storage medium for storing digital data. Thus, it is envisioned that the particle array 112 will be segregated in a predetermined manner to form a large number of distinct storage mediums for storing digital data. At least some of the particles 114 are switchable from a first state to at least a second state in response to exposure of such particles 114 to light of predetermined wavelengths. The particles 114 have a first emission in the first state, and a second emission in the second state wherein the first and second emissions are different. For example, the first and second emissions can be spectral emissions. Examples of substances for forming the particles 114 are discussed above, as well as the spectral emissions for such substances.

The term "between" as used herein refers to the switching from a first state to at least a second state and vice versa. It should be understood that some substances forming the particles 114 may be optically switchable between more than two states.

The storage device 100 is also provided with a controller 124. The controller 124 is operably connected to the first writing light 102, the second writing light 104, the photodetector 108, and the probing light 106 via signal paths 126, 128, 130, and 132. In general, the controller 124 controls the first writing light 102 and the second writing light 104 e.g. outputs signals, to encode digital information into selected particles 114 or groups of particles 114 of the particle array 112. Once the digital information is encoded into the particle array 112, the controller 124 outputs signals to the probing light 106 and receives signals from the photodetector 108 to retrieve selected information from the particle array 112. The controller 124 or other computer or apparatus forming the storage device 100 is programmed to recognize signals indicative of the first and second emissions so as to decode the signals received by the photodetector 108. The controller 124 can be formed of a microprocessor, microcontroller or other logical device capable of carrying out or providing the functions discussed herein. Microprocessors and microcontrollers are well known in the art, and thus a detailed discussion of how to make and use microprocessors and microcontrollers is not deemed necessary to teach one skilled in the art how to make and use the controller 124.

As discussed above, the first writing light 102 and the second writing light 104 selectively emit photons which are capable of being directed to particular particles 114 within the particle array 110 as indicated by the lines 136 and 138. When one or more of the particles 114 is exposed to the photon emitted by the first writing light 102, the particle 114 changes from a first state, such as a logic state one to a second state, such as a logic state zero. When the particle 114 is exposed to the photon 38 emitted by the second writing light 14, the status of the particle is changed from the second state to the first state.

The particles 114 can be formed of any substance capable of being switched between at least two states by the exposure to photons. For example, the particles 114 can be formed of $Eu^{3+}$-doped substances, such as $ZnS:Eu^{3+}$; $AgI$; $Ag^+$; $Eu^{2+}$ doped particles such as $BaFBr:Eu^{2+}$; or $ZnS:Cu^+$, $ZnS:Ag^+$. The methods of making such substances are set forth herein above.

As an example, the emission of $Eu^{3+}$ can be quenched by UV irradiation and this quenching can be recovered by visible light stimulation. This is a reversible optical process that can be used for optical storage. That is, the first writing light 102 can emit the photons 136 having a wave length suitable to form a visible light stimulation. The first writing light 102 can be selected so as to provide the photons 136 forming visible light and the second writing light 104 can be selected to provide the photons 38 forming the UV irradiation. In general, the wavelengths of the photons 136 and 138 emitted by the first and second writing lights 102 and 104 can vary widely and are determined by the properties of the particle 114, as discussed above.

The probing light 106 emits photons 140 of a selected wavelength to determine the state of the particles 114. In one preferred embodiment, the probing light 106 causes the particles 114 to luminesce or otherwise form the first or second emissions so that the first or second emissions are received by the photodetector 108. The wavelength of the probing light 106 is selected to cause the particles 114 to create the first or second emissions without causing the switching of the state of the nanoparticles 114. Thus the information stored by the nanoparticles 114 is retained. In the example discussed above with respect to the particles 114 including $Eu^{3+}$, a suitable wavelength for the probing light 106 is in the Infra red range.

While the first writing light 102, the second writing light 104, and the probing light 106 have been shown and described separately, it should be understood that the first-writing light 102, the second writing light 104, and the probing light 106 can either be separate light sources or a single light source which is tunable to output different wavelengths. In a similar manner, the path between the first writing light 102, the second writing light 104, and the probing light 106 and the particles 114 can either be separate paths or the same path.

As will be understood by those skilled in the art, the storage device 10 also includes one or more mechanical assemblies (not shown) for moving the first writing light 102, the second writing light 104, and the probing light 106 relative to the image plate 110, or for moving the image plate 110 relative to the first writing light 102, the second writing light 104, and the probing light 106 or combinations thereof. These types of mechanical assemblies are typically constructed of tracks and stepper motors and are well known in the art. Thus, a detailed description of the mechanical assemblies is not deemed necessary to teach one skilled in the art how to make and use the mechanical assemblies.

Moreover, it will be understood by those skilled in the art that various lenses or other optical assemblies, such as masks, can be used to focus or expose only desired portions of the image plate 110 to the photons 136, 138, and 140 emitted by the first writing light 102, the second writing light 104, and the probing light 106. For example, a mask can be applied between the image plate 110 and the first writing light 102, the second writing light 104, and the probing light 106.

The image plate 102 can be used for various applications where a multiple read-writable storage medium is desired. For example, the image plate 102 can be used in the formation of floppy or portable disks, CD-ROMS, hard disks, memory, optical imaging and medical diagnostics, radiation detection and infrared sensors.

REFERENCES

The following references, to the extent that they provide exemplary procedural or other details supplementary to those set forth herein, are specifically incorporated herein by reference in their entirety as though set forth herein particular.

Aitken, M. J. An introduction to Optical Dating, Oxford Science Publications (1998)

Akselrod, M. S., A. Lucas, J. C. Polf and S. W. S. Mckeever, Readiation Measurements, 29, 391 (1998)

Bandyopadhyay, P. K., G. W. Russell, and K. Chakrabarti, Radiat. Measurements, 30, 51 (1999)

Bawendi, M. G., W. L. Wilson, L. Rothberg, P. J. Carrol, T. M. Jedju, M. L. Steigerwald, and L. E. Brus, Phys. Rev. Lett. 65, 1623 (1990)

Bein, T., *Inclusion Chemistry of Organometallics in Zeolites*, in *Comprehensive Supramolecular Chemistry*, ed. by J. L. Atwood, J. Eric D. Davies, D. D. MacNicol, F. Vogtle and J-M. Lehn, Vol. 7 ed. by G. Alberti and T. Bein, P 579, New York, Pergamon (1996); K. Moller and T. Bein, Chem. Mater. 10, 2950 (1998)

Bhargava, R. N., J. Lumin. 70, 85 (1994)

Bhargava, R. N., D. Gallagher, X. Hong and A. Nurmikko, Phys. Rev. Lett. 72, 416 (1994)

Bogucki, T. M., D. P. Trauernicht, and T. E. Kocher, Kodak Technical and Science Monograph, 1995, No. 6

Brelle, M. C. and J. Z. Zhang, *J. Chem. Phys.*, 108, 3119 (1998).

Brown, M. R., A. F. Cox, W. A. Shand, H. Thomas and J. M. Williams, J. Lumin., 1970, 1/2, 78

Brus, L. E., in *Nanotechnology*, ed. G. Timp, Springer-Verlag,

Carnell, W. T., *Handbook on the Physics and Chemistry of Rare Earths*, Vol. 3, 171 (1979).

Chakrabarti, K., V. K. Mathur, L. A. Thomas, and R. J. Abbundi, J. *Appl. Phys.*, 65, 2021 (1989).

Chen, W., Photostimulated and thermo-stimulated luminescence of X-ray storage phosphors, Ph. D. Thesis, Peking University, China, 1992.

Chen, Wei, J. Q. Song and M. Z. Su, J. Appl. Phys. 81, 3170 (1997)

Chen, W., M. Z. Su, Appl. Phys. Lett., 70, 301 (1997)

Chen, Wei, Z. G. Wang, Z. J. Lin, and L. Y. Lin, Physics Letters A, 232; 391–394 (1997)

Chen, Wei, Zhangou Wang, Zhaojun Lin and Lanying Lin, *Applied Physics Letters*, 1997, 70(11):1465–1467

Chen, Wei, Zhangou Wang, Zhaojun Lin and Lanying Lin, *J. Appl. Phys.*, 1997, 82(6):3111–3115

Chen, Wei, Zhangou Wang, Lanying Lin, *Journal of Luminescence*, 1997, 71:151–156

Chen, Wei, Z. G. Wang, Z. J. Lin, L. Y. Lin, K. M. Fang, Y. Xu, M. Z. Su, and J. H. Lin, J. Appl. Phys., 83(7), 3811–3815 (1998)

Chen, W., M. Z. Su, J. Phys. Chem. Sol. 60, 371–378 (1999)

Chen, Wei, X. H. Zhang and Y. Huang, Appl. Phys. Lett. 17, 2328 (2000)

Chen, W., R. Sammynaiken, and Y. Huang, *J. Appl. Phys.*, 88, 1424 (2000).

Chen, W., R. Sammynaiken, Y. Huang, J. Appl. Phys. 2000, 88, 5188 (2000)

Chen, Wei; J. O. Malm; V. Zwiller; Y. Huang; S. M. Liu; R. Wallenberg; J. O. Bovin; L. Samuelson *Phys. Rev. B.* 2000, 61,11021–11024.

Chen, Wei, G. H. Li, J.-O. Maim, Y. Huang, R. Wallenberg, H. Han, Z. P. Wang, and J. O. Bovin, J. Lumin. (in press 2000)

Chen, W., Reversible Optical Processes and Optical Storage of Nanoparticles, U.S. Patent Disclosure filed Oct. 16, 2001

Chen, Wei, Up Up-Conversion Luminescence of $Mn^{2+}$ Doped Semiconductor Nanoparticles, US Patent, filed, Jun. 8, 2001

Chen, Wei, Alan G. Joly, and Jin. Z. Zhang, Up-Conversion Luminescence of $Mn^{2+}$ in ZnS:Mn Nanoparticles, *Phys. Rev. B*, 2001, 64, 0412021–4®).

Chen, Wei, Alan G. Joly, and Joel Roark, Photostimulated Luminescence Mechanisms and Kinetics of AgI nanoparticles in zeolite-Y (in preparation)

Chen, Wei, Alan G. Joly, and Joel Roark, Photostimulated Luminescence Mechanisms and Kinetics of Ag nanoparticles in zeolite-Y (in preparation)

Chen, W., Luminescence, Storage Mechanisms and Applications of X-ray Storage Phosphors, in "Handbook of Luminescence and Display Materials", edited by B. R. Vaddi and H. S. Nalwa, American Scientific Publishers, 2002 (in press).

Coffer, J. L., J. Cluster Science, 8, 159 (1997)

Cowen, A. R., G. J. S. Parkin, and P. Hawkridge, Eur. Radiol. 1997, 7, 918

Cowen, A. R., J. H. Launders, M. Jadav, and D. S. Brettle, Phys. Med. Biol. 1997, 42, 1533

Crawford, M. K. and L. H. Brixner, J. Lumin. 48–49, 37 (1991)

Curthbert, J. D. and D. G. Thomas, Phys. Rev. 154, 763 (1967)

Decher, G.; Hong, J. D. *Macromol. Chem., Macromol. Symp.* 1991, 46, 321.

Decher, G.; Lehr, B.; Lowack, K.; Lvov, Y.; Schmitt, J. *BIOSENS. BIOELECTRON.* 1994, 9, 677–684.

Dong, Y. and M. Z. Su, J. Lumin. 65, 263 (1995)

Fan, W., Y. Wang, X. Hou, L. Du, W. Zhao, B. Yang, and L. Niu, *J. Appl. Phys.*, 85, 451 (1999).

Fedrigo, S., W. Harbich, and J. Buttet, *J. Chem, Phys.*, 99, 5712 (1993).

Felix, C., C. Sieber, W. Harbich, J. Buttet, I. Rabin, W. Schulze, and G. Ertl, *Chem. Phys. Lett.*, 313, 105 (1999).

Felix, C., C. Sieber, W. Harbich, J. Buttet, I. Rabin, W. Schulze, and G. Ertl, *Phys. Rev. Lett.*, 86, 2992 (2001).

Finley, J. J. et al., Appl. Phys. Lett., 73, 2618 (1998)

Freedhoff, M. I., A. P. Marchetti, and G. L. McLendon

Gasiot, J., P. Braunlich, and J. P. Fillard, *Appl. Phys. Lett.*, 40, 376 (1982).

Gurvich, A. M., R. S. Mil'shtejn, M. G. Myakhkova, S. I. Golovkova, J. Ruediger, and V. P. Kavtorova, *Rad. Prot. Dosimetry*, 34, 265 (1990).

Hamilton, J. F., *Adv. Phys.*, 37, 359 (1988).

*Handbook of Nanostructured Materials and Nanotechnology*, edted by Dr. Hari Singh Nalwa, Volumes 1–5, San Diego, 1999

*Handbook of Nanostructured Materials and Nanotechnology: Optical Properties*, Volume 4, edited by Hari Singh Halwa, Academic Press, 2000.

Hangleiter, T., F. K. Koschnick, J-M. Spaeth, R. H. D. Nuttal and R. S. Eachus, J. Phys. Condens. Matter, 2, 6837(1990)

Harbich, W., S. Fedrigo, F. Meyer, D. M. Lindsay, J. Lignieres, J. C. Rivoal, and D. Kreisle, *J. Chem. Phys.*, 93, 8535 (1990).

Hasan, Z., L. Biyikli, and P. I. Macfarlane, Appl. Phys. Lett., 1998, 72, 3399

Henry, C. H. and K. Nassau, J. Lumin. 1&2, 299(1970)

Herron, N., J. Inclusion Phenomena and Molecular Recognition in Chemistry, 21, 283 (1995)

Hess, B. C., I. G. Okhrimenko, R. C. Davis, B. C. Stevens, Q. A. Schulzke, K. C. Wright, C. D. Bass, C. D. Evans, and S. L. Summers, Phys. Rev. Lett. 86, 3132 (2001)

Holliday, K., C. Wei, M. Croci, and U. P. Wild, J. Lumin., 53, 227 (1992)

Hong, K., R. S. Meltzer, B. Bihari, D. K. Willians and B. M. Tissue, J. Lumin. 76–77, 234 (1998)

http://home.fujifilm.com/products/science/ip/principle-.html http://www.ml.wpafb.af.mil Iwabuchi, Y., N. Mori, K. Takahashi, T. Matsuda and S. Shionaya, Jpn. J. Appl. Phys., 33, 178 (1994)

Jacobs, P. A., J. B. Uytterhoeven, and H. Beyer, *J. Chem. Soc. Faraday Trans.* 75, 56 (1979).

Jia, W., H. Yuan, L. Lu, H. Liu, and W. M. Yen, *J. Lumin.*, 76–77, 424 (1998).

Jia, W., H. Yuan, S. Holmstrom, H. Liu, and W. M. Yen, J. Lumin. 83–84, 465 (1999)

Joly, Alan G., Wei Chen, and Jin. Z. Zhang, Temperature dependence of Up-Conversion Luminescence of $Mn^{2+}$ in ZnS:Mn Nanoparticles, *Phys. Rev. B* (submitted).

Jorgensen, C. K., in Halogen Chemistry, Vol. 1, P65, Academy Press, N.Y. (1967)

Kaszuba, M., J. Nanoparticle Research, 1, 405 (1999)

Kellerman, R. and J. Texter, *J. Chem. Phys.*, 70, 1562 (1979).

Knox, R. S., *Theory of Excitons*, Solid State Physics Supplement 5, academic Press, New York, 1963, P120

Koschnik, F. H., J. M. Spaeth, R. S. Eachus, W. G. Mcdugle, and R. H. D. Nuttal, Phys. Rev. lett. 67, 3571 (1991).

Koto, K., Photostimualable phosphor radiography design consideration, *American Association of Physicists in Medicine Monograph* #20, Woodbury, N.Y.: AIP, 1994, 731–769

Kotov, N. A.; Dekany, I.; Fendler, J. H. *J. Phys. Chem.* 1995, 99, 13065–13069.

Lakshmanan, A. R., Phys. Stat. Sol. A153, 3 (1996)

Lesser, C., M. Gao, S. Kirstein, Materials Science & Engineering, C8–9, 159 91999)

Lindmyer, J., Sol. Stat. Technol. 31, 135 (1988)

Lundstrom, T., W. Schoenfeld, H. Lee, P. M. Petroff, Science, 286, 2312 (1999)

Marchetti, A. P., A. A. Muenter, R. C. Baetzold, and R. T. McCleary, *J. Phys. Chem. B*, 102, 5287 (1998).

Masumoto, Y., J. Lumin. 70, 386 (1996)

Masumoto, Y. and S. Ogasawara, Jpn. J. Appl. Phys., 38, L623 (1999)

Masumoto, Y. and S. Ogasawara, J. Lumin., 87–89, 360 (2000)

MacMabon, H., S. Sanada, K. Doi, M. Giger, X. W. Xu, F. F. Yin, S. M. Montner, M. Carlin, Radiographics, 11, 259

Meijerink, A. and G. Blasse, *J. Phys. D: Appl. Phys.*, 24, 626 (1991).

Micic, O. I., M. Meglic, D. Lawless, D. K. Sharma, and N. Serpone, *Langmuir*, 6, 487 (1990).

Miyahara, Y. A., Nature, 336, 89 (1988)

Moerner, W. E., *Persistent Spectral Hole-Burning: Science and Aplications*, Springer-verlag, 1988

Nirmal, M., C. B. Murray, D. J. Norris and M. G. Bawendi, Z. Phys. D26, 361(1993)

Nirmal, M. and L. E. Brus, ACC. Chem. Res. 32, 407 (1999)

Norris, D. J., M. Nirmal, C. B. Murray and M. G. Bawendi, Z. Phys. D26, 355 (1993)

Nugent, L. J., In: K. W. Bagnall, Ed. "Lanthanides and Actinides". MIT Int. Rev. Sci. Inorg. Chem., Ser. Two, Butterworths, 7, 195 (1975)

Ozin, G. A., F. Hugues, and S. M. Mattar, *J. Phys. Chem.*, 89, 300 (1985).

Ozin, G. A., Adv. Mater. 4, 612 (1992)

Peng, X. G., L. Manna, W. D. Yang, J. Wickham, E. Scher, A. Kadavanich, A. P. Alivisatos, Nature, 404, 59 (2000)

Peng, Z. A. and X. G. Peng, J. Am. Chem. Soc. 123, 183 (2001)

Peyser, L. A., A. E. Vinson, A. P. Bartko, and R. M. Dickson, Science, 291, 103 (2001)

Rabin, I., W. Schulze, and G. Ertl, *J. Chem. Phys*, 108, 5137 (1998).

Rabin, I., W. Shultze, G. Ertl, C. Felix, C. Sieber, W. Harbich, and J. Buttet, *Chem. Phys. Lett.*, 320, 59 (2000).

Rao, R. P., M. de Murcia and J. Gasiot, Radiat. Prot. Dosim. 6, 64 (1984)

Rashba, E. I. and G. E. Gurgenishvili, Soviet Phys.-Solid State, 4, 759 (1962)

Rocke, C., S. Zimmermann, A. Wixforth, and J. P. Kotthaus, Phys. Rev. Lett. 78, 4099 (1997)

Ruter, H. H., H. V. Seggern, R. Reininger and V. Saile, Phys. Rev. Lett. 65, 2438(1990)

Ruter, H. H., H. Von Seggern, R. Reininger, and V. saile, Phys. Stat. Sol. A130, K253 (1992).

Sakabe, N., Acta Crystallogr. A43 (supplement), C-8 (1987)

Secu, M., L. Matei, T. Serban, E. Apostol, Gh. Aldica, and C. Silion, Optical Materials, 15, 115 (2000)

Seggern, H. V., T. Voigt, W. Knupfer, and G. Lange, J. Appl. Phys. 64, 1405 (1988)

Sharma, P., W. H. Jilavi, R. Nass, and H. Schmidt, J. Lumin. 82, 187 (1999)

Shulman, J. R., and W. D. Compton, *Color centers in Solids*, Pergamen Press, New York (1962).

Soltani, P., D. Brower, and G. Storti, Proc. SPIE 1243, 114 (1990)

Sonda, M., M. Takano, J. Miyahara, and H. Kato, Radiology, 148, 833 (1983)

Sun, T. and K. Seff, *Chem. Rev.*, 94, 857 (1994), and references therein.

Sun, L. D., C. H. Liu, C, S. Liao and C. H. Yuan, J. Mater. Chem. 9, 1655 (1999)

Swiatek, K., M. Godlewski, D. Hommel, Phys. Rev. B42, 3628 (1990)

Takahashi, K., K. Kohda, J. Miyahara, Y. Kanemitsu, K. Amitani and S. Shionoya, J. Lumin. 31/32, 266 (1984)

Tamura, Y. and A. Shibukawa, Jpn. J. Appl. Phys., Part 1, 32, 3187 (1993)

Tan, T., and M. Murofushi, J. Imaging Sci. Technol., 38, 1 (1994).

Thoms, M., H. V. Seggern and A. Winnacker, Phys. Rev. B44, 9240 (1991)

Thoms, M., Applied Optics, 35, 3702 (1996)

Tissue, B. M., Chem. Mater. 10, 2837 (1998)

Tiwari, S., F. Rana, H. Hanafi, A. Hartstein, E. F. Crabbe, K. Chan, Appl. Phys. lett. 68,1377(1996)

Tracht, S, L. Cruz, C. M. Stobba-Wiley, and J. V. Sweedler, Anal. Chem. 68, 3922 (1996)

von Seggern, H., T. Voigt, W. Knupfer, and G. Lange, *J. Appl. Phys.*, 64, 1405 (1988).

von Seggern, H., A. Meijerink, T. Voigt, and A. Winnacker, *J. Appl. Phys.*, 66, 4418 (1989).

Wang, Y., Advances in Photochemistry, 19, 179 (1995)

Watanabe, Y., G. Namikawa, T. Onuki, K. Nishio, and T. Tsuchiya, Appl. Phys. Lett. 78, 2125 (2001)

Winnacker, A., R. M. Shelby, R. M. Macfarlane, Opt. Lett. 10, 350 (1985)

Wu, Y. and C. S. Shi, Sol. Stat. Commun. 95, 319 (1995) and Y. Gao, C. S. Shi, and Y. Wu, Mater. Res. Bull. 31, 439 (1996)

Yokonof et al. Japanese patent SHO-61-61894.

Yu, J., H. Liu, Y. Wang, F. E. Fernandez, and W. Jia, *J. Lumin.*, 76–77, 252 (1998).

Yusa, G. and H. Sakaki, Appl. Phys. Lett., 70, 345 (1997)

Van Bekkum, E. M. Flanigen, J. C. Jansen, *Introduction to Zeolite Science and Practice*, Elsevier, Amsterdam, 1991

Zaitoun, M. A., T. Kim, and C. T. Lin, J. Phys. Chem. B102, 1122(1998)

Zaitoun, M. A., D. M. Goken, L. S. Bailey, T. Kim, and C. T. Lin, J. Phys. Chem. B104, 189(2000)

Zhang, Jin Z., Wei Chen and Alan G. Joly, and, Anti-Stokes Luminescence and kinetics of semiconductor Nanoparticles, will be presented at Fall 2001American Chemical Society Meeting, August 26–30, Chicago, Ill.

Zhou, J., L. T. Li, Z. L. Gui, S. Buddhudu, Y. Zhou, Appl. Phys. Lett. 76, 1540 (2000)

Zimmermann, S., A. Wixforth, J. P. Kotthaus, W. Wegscheider, M. Bichler, Science, 283, 1292 (1999)

The invention claimed is:

1. An imaging plate for use in a digital imaging system to store energy patterns, comprising:
   a substrate; and
   a nanoparticle thin film supported by the substrate, the nanoparticle thin film formed of nanoparticles which cooperate to store energy that is indicative of latent images when the nanoparticles are exposed to such energy.

2. The imaging plate of claim 1, wherein the nanoparticles are capable of storing the energy pattern as at least one of trapped electrons and holes.

3. The imaging plate of claim 2, wherein the nanoparticles are photostimulated luminescence nanoparticles capable of releasing photons of a given first energy upon being stimulated with photons of a second energy, whereby the photons of the second energy are sufficient to trigger the recombination of the electrons and holes.

4. The imaging plate of claim 3, wherein the second energy is less than the first energy.

5. The imaging plate of claim 1, wherein the nanoparticles are capable of switching between a first state and at least one additional state.

6. The imaging plate of claim 1, further comprising a cover assembly positioned substantially adjacent to the nanoparticle thin film.

7. The imaging plate of claim 6, wherein the cover assembly only allows passage of predetermined light energies to and from the imaging plate.

8. The imaging plate of claim 1, wherein the nanoparticle thin film consists of nanoparticles and polymer.

9. The imaging plate of claim 1, wherein the nanoparticle thin film is applied to the substrate by layer-by-layer assembly.

10. A method for converting energy patterns into digital signals, comprising the steps of:

exposing an imaging plate having a nanoparticle thin film supported by a substrate to an energy pattern, the nanoparticle thin film formed of photostimulated luminescence nanoparticles which cooperate to store energy that is indicative of the energy pattern;

optically stimulating the photostimulated luminescence nanoparticles in the thin film and thereby releasing the stored energy causing photostimulated luminescence; and converting the photostimulated luminescence into at least one digital signal indicative of the stored energy.

11. The method of claim 10, further comprising the step of measuring the photostimulated luminescence.

12. The method of claim 11, wherein the photostimulated luminescence is measured using a photodetector selected from the group consisting of a photodiode, photomultiplier tube and a charge coupled device.

13. The method of claim 10, wherein the photostimulated luminescence nanoparticles are optically stimulated with photons of sufficient energy to trigger the recombination of trapped electrons and holes in the nanoparticle thin film.

14. The method of claim 13, wherein the emitted photons have a greater energy per photon than the optically stimulating photons.

15. The method of claim 10, further comprising the steps of:

scanning a laser across the imaging plate thereby optically stimulating the imaging plate to produce photostimulated luminescence;

measuring the photostimulated luminescence at each area on the imaging plate; and converting the photostimulated luminescence measurements into a digital image.

16. The method of claim 10, wherein the stated energy patterns are selected from a group comprising ultraviolet photons, vacuum ultraviolet photons, X-rays, $\alpha$-rays, $\beta$-rays, $\gamma$-rays, electrons or neutrons.

17. A method for converting energy patterns into digital signals, comprising the steps of:

exposing an imaging plate having a nanoparticle array thin film supported by a substrate to an energy pattern, the nanoparticle thin film formed of nanoparticles which cooperate to store energy that is indicative of the energy pattern, wherein the nanoparticles are switchable between a first energy state and at least one additional energy state where light emitted from the nanoparticles in the first state is different from the light emitted from the nanoparticles in the at least one additional energy state;

optically probing the nanoparticles by directing light of a predetermined energy onto at least a portion of the nanoparticle thin film so as to cause nanoparticles exposed to the probe to provide signals;

receiving the signals utilizing a detector; and converting the signals output by the nanoparticles into at least one digital signal indicative of the energy pattern.

18. The method of claim 17, further comprising the steps of:

scanning a laser across the imaging plate thereby optically stimulating the imaging plate to produce luminescence;

measuring the luminescence at each area on the imaging plate; and converting the luminescence measurements into a digital image.

19. The method of claim 17, wherein the energy pattern is selected from a group comprising ultraviolet photons, vacuum ultraviolet photons, X-rays, $\alpha$-rays, $\beta$-rays, $\gamma$-rays, electrons or neutrons.

20. An imaging plate for use in a digital imaging system to store energy patterns, comprising:

a matrix;

a nanoparticle array operatively associated with the matrix, the nanoparticle array formed of nanoparticles which cooperate to store energy that is indicative of latent images when the nanoparticles are exposed to such energy; and a cover assembly positioned substantially adjacent to the nanoparticle array, wherein the cover assembly only allows passage of predetermined light energies to and from the imaging plate.

21. An imaging plate for use in a digital imaging system to store energy patterns, comprising:

a matrix;

a nanoparticle array operatively associated with the matrix, the nanoparticle array formed of nanoparticles which cooperate to store energy that is indicative of latent images when the nanoparticles are exposed to such energy, wherein the nanoparticle array is applied to an exterior surface of the matrix.

* * * * *

UNITED STATES PATENT AND TRADEMARK OFFICE
CERTIFICATE OF CORRECTION

| | |
|---|---|
| PATENT NO. | : 7,126,136 B2 |
| APPLICATION NO. | : 11/067373 |
| DATED | : October 24, 2006 |
| INVENTOR(S) | : Wei Chen |

It is certified that error appears in the above-identified patent and that said Letters Patent is hereby corrected as shown below:

On the title page: item 75
After "Inventor:" delete "Stillwater" and replace with --Oklahoma City--

Col. 3:

Line 10 - Before the word "observed" and after the word "group" insert --(L.A. Peyser, A.E. Vinson, A.P. Bartko, and RM. Dickson, "Photoactivated fluorescence from individual silver nanoclusters", *Science*, 2001, *291*, 103-106.)--

Line 22- Before the word "showed" and after the word "group" insert --(Y. Watanabe, G. Namikawa, T. Onuki, K. Nishio, T. Tsuchiya, "Photosensitivity in phosphate glass doped with $Ag^+$ upon exposure to near-ultraviolet femtosecond laser pulses", Applied Physics Letters, Volume 78, Issue 15, April 9, 2001, pp. 2125-2127)--

Line 46 - Delete "FIG. 3 is a graphical representation showing photoluminescence excitation (PLE, emission at 407 nm) and emission photoluminescence (PL, excitation at 304 nm) spectra of $BAFBr:Eu^{2+}$ nanoparticles." Replace with --FIG. 3 is a graphical representation showing fluorescence excitation spectra of AgI/Y before (a) and after UV irradiation at 254 nm for 5 (b), 8 (c), 11 (d), and 15 minutes (e) respectively.--

Line 50- Delete "FIG. 4 is a graphical representation of the emission spectra of $BaFBr:Eu^{2+}$ nanoparticles before (1) and after UV irradiation at 254 nm for 3 (2), 5 (3), 10 (4), and 15 (5) minutes, respectively with the excitation at 304 nm." Replace with -- FIG. 4 is a graphical representation showing photoluminescence spectra of AgI/Y before (a) and after (b) UV irradiation at 254 nm for 5 minutes. After exposure to a visible Tamp for 5 minutes (C).--

Line 54- Delete "FIG. 5 is a graphical representation of 304 nm excited photoluminescence (PL) and 600 nm stimulated PSL spectra of $BaFBr:Eu^{2+}$ nanoparticles after UV irradiation for 10 minutes, respectively." Replace with --FIG. 5 is a graphical representation showing PSL spectra of AgI/Y after UV irradiation at 254 nm for 10 minutes and thereafter excitation at 840 nm.--

Line 58- Delete "FIG. 6 is a graphical representation of PSL decays of bulk and $BaFBr:Eu^{2+}$ nanoparticles excited at 560 nm." Replace with --FIG. 6 is a graphical representation showing electron spin resonance of AgI/Y before (a) and after UV irradiation at 254 nm for 8 minutes (b) and 15 minutes (c), respectively.--

UNITED STATES PATENT AND TRADEMARK OFFICE
CERTIFICATE OF CORRECTION

| | | |
|---|---|---|
| PATENT NO. | : 7,126,136 B2 | |
| APPLICATION NO. | : 11/067373 | |
| DATED | : October 24, 2006 | |
| INVENTOR(S) | : Wei Chen | |

It is certified that error appears in the above-identified patent and that said Letters Patent is hereby corrected as shown below:

Col. 3 (cont'd)

Line 60 - Delete "FIG. 7 is a graphical representation showing fluorescence excitation spectra of AgI/Y before (a) and after UV irradiation at 254 nm for 5 (b), 8 (c), 11 (d), and 15 minutes (e) respectively." Replace with --FIG. 7 is a graphical representation showing the 310 nm excited photoluminescence spectra of Ag/Y before (a), and after UV irradiation at 254 nm for 10 minutes (b), then exposure to a 840 nm light for 10 minutes (c), then a 650 nm light for 10 minutes (d), and then to a visible lamp for 10 minutes (e). Trace (f) is the photostimulated luminescence spectrum stimulated at 840 nm.--

Line 64 - Delete "FIG. 8 is a graphical representation showing photoluminescence spectra of AgI/Y before (a) and after (b) UV irradiation at 254 nm for 5 minutes. After exposure to a visible lamp for 5 minutes (c)." Replace with --FIG. 8 is a graphical representation showing lifetime decays of (a) photoluminescence (excitation at 305 nm) and (b) photostimulated luminescence (excitation at 800 nm) in AgI/Y nanoparticles. The inset in (a) displays the PL lifetime at higher time resolution showing the fast (< 15 ns) time component.--

Col. 4:
Line 1- Delete "FIG. 9 is a graphical representation showing PSL spectra of AgI/Y after UV irradiation at 254 nm for 10 minutes and thereafter excitation at 840 nm." Replace with --FIG. 9 is a graphical representation showing lifetime decays of (a) photoluminescence (excitation at 305 nm) and (b) photostimulated luminescence (excitation at 800 nm) in Ag/Y nanoparticles. The inset in (a) displays the PL lifetime at higher time resolution showing the fast (< 15 ns) time component.--

Line 4- Delete "FIG 10 is a graphical representation showing electron spin resonance of AgI/Y before (a) and after UV irradiation at 254 nm for 8 minutes (b) and 15 minutes (c), respectively. Replace with --FIG. 10 is a schematic representation of the energy levels of the photophysical processes in Ag/Y and AgI/Y nanoparticles. Solid lines represent photon excitation, dashed lines represent luminescence, and dotted lines represent energy transfer between levels.--

Line 7- Delete "FIG 11 is a graphical representation showing the 310 nm excited photoluminescence spectra of Ag/Y before (a), and after UV irradiation at 254 nm for 10 minutes (b), then exposure to a 840 nm light for 10 minutes (c), then a 650 nm light for 10 minutes (d), and then to a visible lamp for 10 minutes (e). Trace (f) is the photostimulated luminescence spectrum stimulated at 840 nm." Replace with --FIG. 11 is a graphical representation showing photoluminescence excitation (PLE, emission at 407 nm) and emission photoluminescence (PL, excitation at 304 nm) spectra of $BAFBr:Eu^{2+}$ nanoparticles.--

UNITED STATES PATENT AND TRADEMARK OFFICE
CERTIFICATE OF CORRECTION

PATENT NO. : 7,126,136 B2
APPLICATION NO. : 11/067373
DATED : October 24, 2006
INVENTOR(S) : Wei Chen Page 3 of 6

It is certified that error appears in the above-identified patent and that said Letters Patent is hereby corrected as shown below:

Col. 4 (cont'd)

Line 14- Delete "FIG. 12 is a graphical representation showing lifetime decays of (a) photoluminescence (excitation at 305 nm) and (b) photostimulated luminescence (excitation at 800 nm) in AgI/Y nanoparticles. The inset in (a) displays the PL lifetime at higher time resolution showing the fast (< 15 ns) time component." Replace with --FIG. 12 is a graphical representation of the emission spectra of BaFBr: $Eu^{2+}$ nanoparticles before (1) and after UV irradiation at 254 nm for 3 (2), 5 (3), 10 (4), and 15 (5) minutes, respectively with the excitation at 304 nm.--

Line 20- Delete "FIG 13 is a graphical representation showing lifetime decays of (a) photoluminescence (excitation at 305 nm) and (b) photostimulated luminescence (excitation at 800 nm) in Ag/Y nanoparticles. The inset in (a) displays the PL lifetime at higher time resolution showing the fast (< 15 ns) time component." Replace with --FIG. 13 is a graphical representation of 304 nm excited photoluminescence (PL) and 600 nm stimulated PSL spectra of BaFBr:$Eu^{2+}$ nanoparticles after UV Irradiation for 10 minutes, respectively.--

Line 26- Delete "FIG. 14 is a schematic representation of the energy levels of the photophysical processes in Ag/Y and AgI/Y nanoparticles. Solid lines represent photon excitation, dashed lines represent luminescence, and dotted lines represent energy transfer between levels." Replace with --FIG. 14 is a graphical representation of PSL decays of bulk and BaFBr:$Eu^{2+}$ nanoparticles excited at 560 nm.--

Line 32- Delete "FIG. 15 is a graphical representation showing the emission spectra of BaFBr:$Eu^{3+}$ nanoparticles before (1) and after UV irradiation at 225 nm for 5 (2), 10 (3) and 15 mm (4), then exposure to a 600 nm light for 5 mm (5) and then to a visible lamp for 15 min, respectively." Replace with --FIG. 15 is a graphical representation of the absorption(a), fluorescence(b) and PSL(c) of CdTe nanoparticles.--

Line 37- Delete "FIG. 16 is a graphical representation showing the emission spectra of $Eu^{3+}$-zeolite-Y before (1) and after (2) UV irradiation at 254 nm for 5 min, and then to a visible lamp for 10 mm (4), respectively." Replace with --FIG. 16 is a graphical representation showing the emission spectra of BaFBr:$Eu^{3+}$ nanoparticles before (1) and after UV -irradiation at 225 nm for 5 (2), 10 (3) and 15 min (4), then exposure to a 600 nm light for 5 min (5) and then to a visible lamp for 5 min (6) and 15 min (7), respectively.--

Line 41- Delete "FIG. 17 is a graphical representation of how electrons and holes are produced in nanoparticles and, more specifically, in $Eu^{3+}$ doped nanoparticles." Replace with --FIG. 17 is a graphical representation showing the emission spectra of $Eu^{3+}$-zeolite-Y before (1) and after (4) UV -irradiation at 254 nm for 5 min, then exposure to a 840 nm light for 5 min (3), and then to a visible lamp for 10 min (2), respectively.--

UNITED STATES PATENT AND TRADEMARK OFFICE
CERTIFICATE OF CORRECTION

| | |
|---|---|
| PATENT NO. | : 7,126,136 B2 |
| APPLICATION NO. | : 11/067373 |
| DATED | : October 24, 2006 |
| INVENTOR(S) | : Wei Chen |

It is certified that error appears in the above-identified patent and that said Letters Patent is hereby corrected as shown below:

Col. 4 (cont'd)

Line 44- Delete "FIG. 18 is a graphical representation of the emission spectra of $Y_2O_3:Tb^{3+}$, $Eu^{3+}$ nanoparticles before and after x-ray irradiation for 10 minutes." Replace with --FIG. 18 is a graphical representation of how electrons and holes are produced in nanoparticles and, more specifically, in $Eu^{3+}$ doped nanoparticles.--

Line 47- Delete "FIG. 19 is a graphical representation of the absorption(a), fluorescence (b) and PSL(c) of CdTe nanoparticles" Replace with --FIG. 19 is a graphical representation of the emission spectra of $Y_2O_3:Tb^{3+}$, $Eu^{3+}$ nanoparticles before and after x-ray irradiation for 10 minutes.--

Line 59- Delete "FIG. 25 is a schematic illustration $ZnS:Mn^{2+},Eu^{3+}$ nanoparticles for optical storage." Replace with --FIG. 25 is a schematic illustration of charge transfer in $ZnS:Mn^{2+},Eu^{3+}$ nanoparticles for optical storage.--

Col. 6:
Line 1- Delete "x>0 or x<=1" and replace with --x>0 and x<=1--.

Line 34- After "where" delete "$\Gamma_H$ in the" and replace with --$\Gamma_I$ is the--.

Col.7:

Line 31- After the word "to" and before the word "size" delete the letter --z--.

Col. 8:

Line 43- In Table 1, after the word "Considerations" and before the abbreviation "PSL" insert the word --for--.

Line 53- In Table 1, after the word "High" and before the word "resolution" delete "imgae" and replace with
--image--.

Col. 9:

Line 7- Delete "Eu2+, Ce3+ and Ag+" and replace with --$Eu^{2+}$, $Ce^{3+}$ and $Ag^+$--.

Line 50- After the abbreviation "Apr." delete "1998U)" and replace with --1998))--.

Col. 16:

Line 58- After the word "of" and before the abbreviation "nm" delete "2.5 and 5" and Replace with --2.5, 5, and 7--.

UNITED STATES PATENT AND TRADEMARK OFFICE
CERTIFICATE OF CORRECTION

PATENT NO. : 7,126,136 B2
APPLICATION NO. : 11/067373
DATED : October 24, 2006
INVENTOR(S) : Wei Chen It is certified that error appears in the above-identified patent and that said Letters Patent is hereby corrected as shown below:

Col. 18:

Line 31- After the word "the" and before the word "band" delete "$5D_0 \rightarrow {}^7F_2$" and Replace with --$^5D_0 \rightarrow {}^7F_2$ --.

Line 56- After the word "the" and before the number "(3.40)" delete "X(Eu$^{4+}$)" and replace with --$\chi$(Eu$^{4+}$)--.

Col. 19:

Line 62- After the word "Xray" and before the abbreviation (XRD)" delete the word "Deflection" and insert the word --Diffraction--.

Col. 20:

Line 1- After the word "transmission" and before the word "microscope' insert the word -- electron --.

Line 13- After the word "of" and before the word "nanoparticles" delete "ZnS:Mn+$^2$, Eu+$^2$" and replace with --ZnS:Mn$^{2+}$,Eu$^{3+}$--.

Col. 21:

Line 19- After "a" and before "process" delete "selinazation" and insert --sulfurization--.

Col. 22:

Line 18- Delete "emulson_OG" and replace.with --emulsogen_OG--.

Col. 24:

Line 20- After the word "to" and before the word "with" delete "4x10 photons per pixel (1:5x10)," and replace with --4x10$^5$ photons per pixel (1:5x10$^4$),--.

Col. 27:

Line 1- Delete the number "38" and replace with the number --138--.

Line 2- Delete the number "14" and replace with the number --104--.

UNITED STATES PATENT AND TRADEMARK OFFICE
CERTIFICATE OF CORRECTION

PATENT NO. : 7,126,136 B2
APPLICATION NO. : 11/067373
DATED : October 24, 2006
INVENTOR(S) : Wei Chen It is certified that error appears in the above-identified patent and that said Letters Patent is hereby corrected as shown below:

Col. 27: (cont'd)

Line 19- Delete the number "38" and replace with the number --138--.

Line 48- Delete the number "10" and replace with the number --100--.

Col. 28

Line 1- Delete the number "102" and replace with the number --110--.

Line 3- Delete the number "102" and replace with the number --110--.

Line 40- After the word "Verlag," insert the number --1999--.

Col. 33:

Line 40- After the word "nanoparitcle" and before the word "thin" delete the word "array".

Signed and Sealed this

Thirty-first Day of July, 2007

JON W. DUDAS
*Director of the United States Patent and Trademark Office*